United States Patent [19]

Yoshida et al.

[11] Patent Number: 5,500,869
[45] Date of Patent: Mar. 19, 1996

[54] SEMICONDUCTOR LASER ARRAY DEVICE, SEMICONDUCTOR LASER DEVICE, AND PRODUCTION METHODS THEREFOR

[75] Inventors: Yasuaki Yoshida; Yasuo Nakajima; Masao Aiga, all of Itami, Japan

[73] Assignee: Mitsubishi Denki Kabushiki Kaisha, Tokyo, Japan

[21] Appl. No.: 216,609

[22] Filed: Mar. 23, 1994

[30] Foreign Application Priority Data

Mar. 23, 1993 [JP] Japan .................................. 5-063607
Sep. 16, 1993 [JP] Japan .................................. 5-230392

[51] Int. Cl.⁶ ............................ H01S 3/18; H01S 3/25; H01S 3/025
[52] U.S. Cl. ............................ 372/50; 257/82; 257/88; 257/98; 437/129
[58] Field of Search ........................... 372/80, 43, 36, 372/101, 31; 257/80–82, 88, 98; 437/129; 369/44.37; 385/49, 14

[56] References Cited

U.S. PATENT DOCUMENTS

| | | |
|---|---|---|
| 4,293,826 | 10/1981 | Scifres et al. . |
| 4,411,057 | 10/1983 | Duda et al. . |
| 4,768,199 | 8/1988 | Heinen et al. ............................. 372/36 |
| 4,813,762 | 3/1989 | Leger et al. ............................... 372/18 |
| 4,846,930 | 7/1989 | Stanley ..................................... 372/107 |
| 5,139,609 | 8/1992 | Fields et al. ............................... 372/50 |
| 5,355,386 | 10/1994 | Rothman et al. ......................... 372/50 |
| 5,357,536 | 10/1994 | Andrews ................................... 372/50 |

FOREIGN PATENT DOCUMENTS

| | | |
|---|---|---|
| 0164834 | 4/1985 | European Pat. Off. . |
| 0171615 | 7/1985 | European Pat. Off. . |
| 0089577 | 4/1591 | Japan ...................................... 372/43 |
| 61-29188 | 2/1986 | Japan . |
| 61-116895 | 6/1986 | Japan . |
| 61-281577 | 12/1986 | Japan . |
| 0263791 | 10/1988 | Japan ...................................... 372/43 |
| 0154583 | 6/1989 | Japan ...................................... 372/43 |
| 0084189 | 5/1992 | Japan ...................................... 372/50 |
| 405333232 | 12/1993 | Japan ...................................... 385/49 |

OTHER PUBLICATIONS

Miyagawa et al, "Examination of An Optical Transmission/Receive Module According To Micro–Optics Part Mounting Technique Employing a Silicon Substrate", IEICE Spring Conference, 1992, Mar.

Moria et al, "Trial Manufacture Of A Multi–Channel LD or PD Array Module", IEICE Spring Conference, 1992 Mar.

Primary Examiner—Rodney B. Bovernick
Assistant Examiner—Robert McNutt
Attorney, Agent, or Firm—Leydig, Voit & Mayer

[57] ABSTRACT

A semiconductor laser array device includes a semiconductor laser chip array including a plurality of laser chips each having a prescribed chip width mounted on a bar-shaped supporting substrate and arranged parallel to a length direction of the substrate and determined in position in the optical axis direction of the laser chip and in the length and height directions of the substrate; a monitor photodiode array including a plurality of monitor photodiodes arranged in an array with the same period as that of the laser chip array mounted on the substrate and arranged parallel with the length direction of the substrate and determined in position in the optical axis direction of the laser chips and in the length direction and the height direction of the substrate; a plurality of lenses mounted on the substrate arranged in the length direction of the substrate with the same period as that of the laser chip array, the lens positions being determined in the optical axis direction of the laser chip and in the length direction and the height direction of the substrate. A respective laser chip, monitor photodiode, and lens constitute an individual semiconductor laser device. The distance between the semiconductor laser chip and the monitor photodiode are determined with high precision.

18 Claims, 16 Drawing Sheets

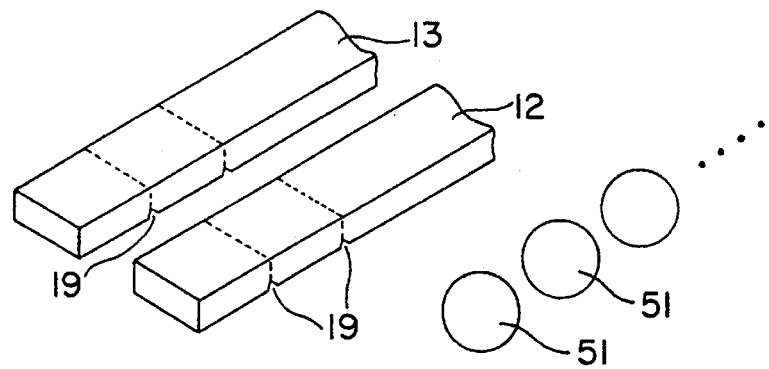
Fig. 12(a)
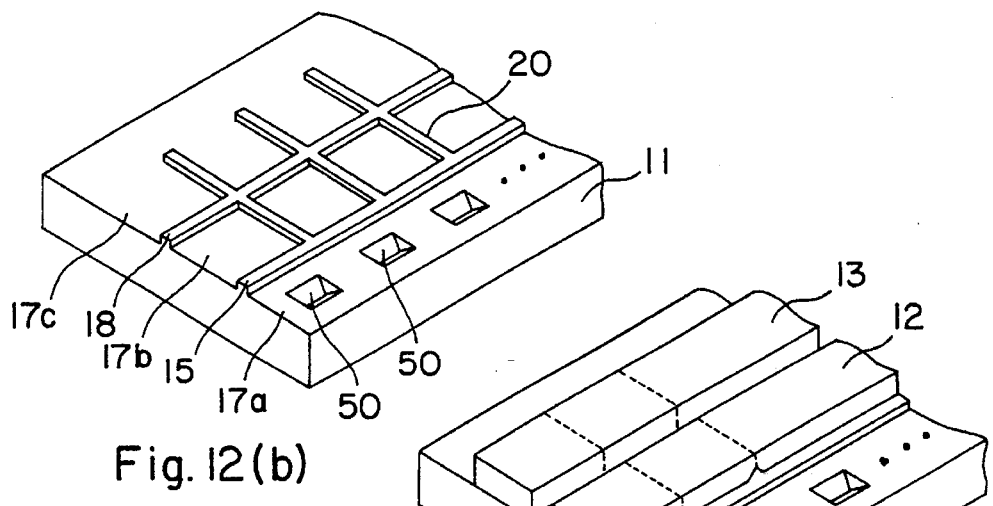
Fig. 12(b)
Fig. 12(c)
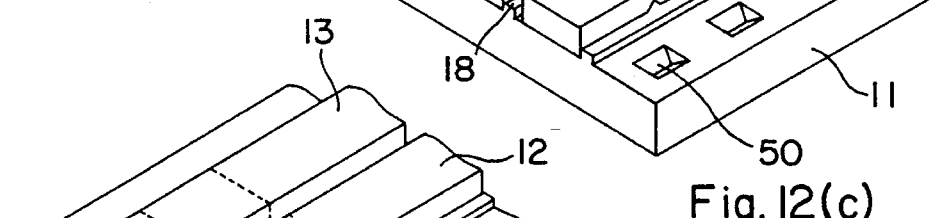
Fig. 12(d)
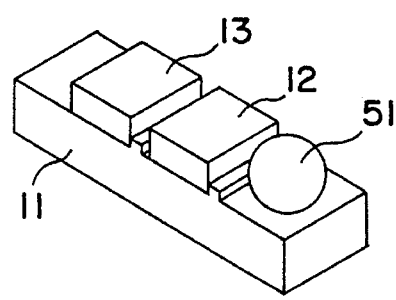
Fig. 12(e)

SEMICONDUCTOR LASER ARRAY DEVICE, SEMICONDUCTOR LASER DEVICE, AND PRODUCTION METHODS THEREFOR

FIELD OF THE INVENTION

The present invention relates to a semiconductor laser array device, a semiconductor laser device, and production methods therefore and, more particularly, to a semiconductor laser device efficiently incorporating a semiconductor laser chip, a monitor photodiode, and a lens.

BACKGROUND OF THE INVENTION

FIG. 11 shows a portion of the prior art semiconductor laser device described in "Examination Of An Optical Transmission/Receive Module According To Microoptics Part Mounting Technique Employing A Silicon Substrate" by Miyagawa et al, Proceedings of the 1992 IEICE Spring Conference, Part 4 C-271. This prior art example incorporates a semiconductor laser with an optical element, such as a lens, for efficiently introducing light output from a semiconductor laser device into an optical fiber.

In FIG. 11, a semiconductor laser chip 2, a monitor photodiode 3, and a spherical lens 4 are mounted on a silicon substrate 1 and the spherical lens 4 is put in a positioning hole 5 so that it is located at a predetermined position relative to the semiconductor laser chip 2. Electrodes 6a and 6b are bonding pads and a bonding wire 7 connects an upper electrode 2a of the semiconductor laser chip 2 and the electrode 6b.

The semiconductor laser chip 2 is welded to a die pad (not shown) on the silicon substrate 1 for position determination. The die pad is connected to an electrode 6a and has approximately the same size as the bottom surface of the semiconductor laser chip 2, and the lower electrode of the semiconductor chip 2 is electrically connected to the electrode 6a via the die pad.

The positions and configurations of the electrodes 6a and 6b, the die pad, and the positioning hole 5 can be established with high precision employing the photolithography techniques used in the manufacture of a silicon integrated circuit.

The size of the spherical lens 4 and the size and depth of the positioning hole 5 are controlled in their production so that the spherical lens 4 occupies a desired position relative to the light emitting point of the semiconductor laser chip 2, i.e., so that the light emitting point of the semiconductor laser chip 2 and the focal point of the lens 4 are aligned with each other. The spherical lens 4 is put in the positioning hole 5 and located at a particular position relative to the semiconductor laser chip 2, and the bottom of the spherical lens 4 is adhered to the silicon substrate 1 with a polyimide adhesive. In addition, a monitor photodiode 3 is arranged at a position opposite to the spherical lens 4 to monitor the light emitted from the rear of the semiconductor laser chip 2.

A silicon substrate 1 is formed with the dimensions required for the manufacture of a semiconductor laser device, for example, a length in the optical axis direction of 2.0–3.0 mm and a thickness of 1.0 mm.

Then, an InP series semiconductor laser chip 2, an InP-based monitor photodiode 3 having dimensions in both vertical and transverse directions of 500 μm and a glass spherical lens of 300 μm–1.0 mm diameter are produced in accordance with the dimensions of the semiconductor laser device.

Thereafter, as shown in the figure, the silicon substrate 1 is etched using photolithography techniques to produce a positioning hole 5 for mounting the spherical lens so that the light emitting point of the semiconductor laser chip 2 is located at the focal point of the spherical lens 4. The laser light from the light emitting point is then efficiently incident on the spherical lens 4.

By employing CrAu evaporation and photolithography techniques, a die pad comprising a CrAu film having the same configuration as the bottom surface of the semiconductor laser chip 2 is formed at a position where the semiconductor laser chip 2 is to be disposed, CrAu films are formed at positions where electrodes 6a and 6b are to be disposed on the silicon substrate 1, and, thereafter, Au electrodes 6a and 6b are formed on the CrAu films. In addition, the semiconductor laser chip 2 is adhered to the die pad by soldering employing AuSn or the like. Then, the lower electrode of the semiconductor laser chip 2 is connected to the electrode 6a via a die pad.

Then, a monitor photodiode 3 is fixed to an end of the silicon substrate 1 opposite the positioning hole 5 for the spherical lens 4 relative to the semiconductor laser chip 2 by soldering employing AuSn or the like so that the laser light emitted from the light emitting point of the semiconductor laser chip 2 and directed backward is monitored.

Next, an Au bonding wire connecting the upper electrode 2a of the semiconductor laser chip 2 to the electrode 6b is attached.

Then, the spherical lens 4 is put in the positioning hole 5, and the lower part of the spherical lens 4 and the bottom of the positioning hole 5 are adhered to each other with a small amount of polyimide-based adhesive, thereby completing the prior art semiconductor laser device.

In this way, the semiconductor chip 2, the monitor photodiode 3, and the spherical lens 4 are placed on a silicon substrate 1, thereby producing a semiconductor laser device than can easily introduce light into an optical fiber. In this construction, however, it is required to place each of the constituent parts, i.e., the semiconductor laser chip 2, the monitor photodiode 3, and the spherical lens 4, at predetermined positions, resulting in complicated work.

FIG. 18 shows a structure for another prior art semiconductor laser device. In the figure, reference numeral 1 designates an Si supporting substrate, reference numeral 4 designates a spherical lens, reference numeral 5a designates a V-shaped groove for positioning produced by etching, and reference numeral 2 designates a semiconductor laser chip.

Anisotropic etching of the Si supporting substrate is carried out with KOH whereby a V-shaped groove having a predetermined aperture width and a predetermined depth is produced. Then, the semiconductor laser chip is positioned relative to the position of the lens 4 by soldering. Further, the spherical lens 4 is engaged in the V-shaped groove 5a and is fixed in place with a resin or the like whereby a semiconductor laser device is produced.

In this semiconductor laser device, lens position is determined by placing the spherical lens 4 in contact with the V-shaped groove 5a and, therefore, the depth and width of the V-shaped groove 5a determine the coupling efficiency between the laser chip 2 and the spherical lens 4. The method of producing the V-shaped groove 5a by combining masking and wet etching is an industrial method that is superior but, when the laser devices are mass-produced, the aperture width of the mask can vary or the width and depth of the V-shaped groove are difficult to reproduce, reducing the coupling efficiency between the laser chip 2 and the lens 4, resulting in reduction in production yield.

In addition, in the prior art semiconductor laser device, the position of the spherical lens is determined by fixing the spherical lens in a positioning aperture. However, variations arise in the width and depth of the positioning aperture due to errors in controlling the etching, so that it is impossible to fix the spherical lens in a predetermined position whereby there is a reduction in production yield.

SUMMARY OF THE INVENTION

It is an object of the present invention to provide a semiconductor laser array device and a semiconductor laser device in which positioning for optical coupling between an optical fiber and a semiconductor laser device is easily performed and production efficiency is improved.

It is another object of the present invention to provide production methods appropriate for producing such a semiconductor laser array device and such a semiconductor laser device.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

According to the present invention, a semiconductor laser array device includes a semiconductor laser chip array comprising a plurality of semiconductor laser chips, each chip having a prescribed chip width; the semiconductor laser chip array being mounted on a bar-shaped supporting substrate and having an array direction parallel to a length direction of the supporting substrate and a position determined in the optical axis direction of the semiconductor laser chip and in the length direction and height directions of the supporting substrate; a monitor photodiode array comprising a plurality of monitor photodiodes arranged in an array with the same period as that of the semiconductor laser chip array, the monitor photodiode array being mounted on the supporting substrate and having an array direction parallel to the length direction of the supporting substrate and a position determined in the optical axis direction of the laser chip and in the length and height directions of the support substrate; a plurality of lenses mounted on the supporting substrate with the same period as that of the semiconductor laser chip array, the position of the plurality of lenses being determined in the optical axis direction of the laser chip and in the length and height directions of the supporting substrate; each of the semiconductor laser chips, each of the monitor photodiodes, and each of the plurality of lenses consisting of an individual semiconductor laser device.

BRIEF DESCRIPTION OF THE DRAWINGS

FIGS. 12(a) through 12(e) are perspective views illustrating steps of a process of producing a semiconductor laser array device according to a fifth embodiment of the present invention.

DETAILED DESCRIPTION OF PREFERRED EMBODIMENTS

EMBODIMENT 1

Figure 1:
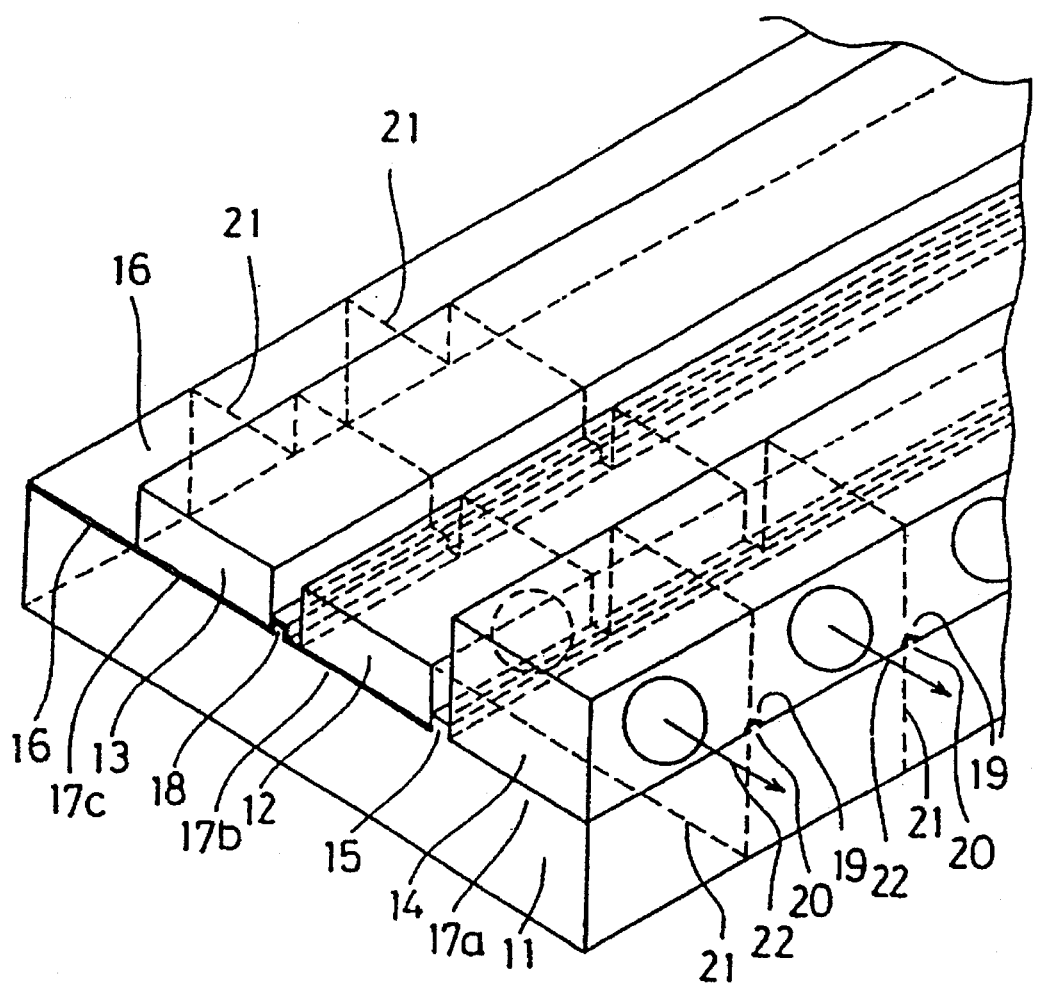
FIG. 1 is a perspective view illustrating a semiconductor laser array device according to a first embodiment of the present invention.
Figure 1:
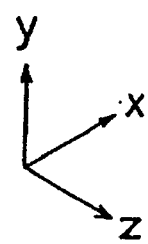
Figure 2:
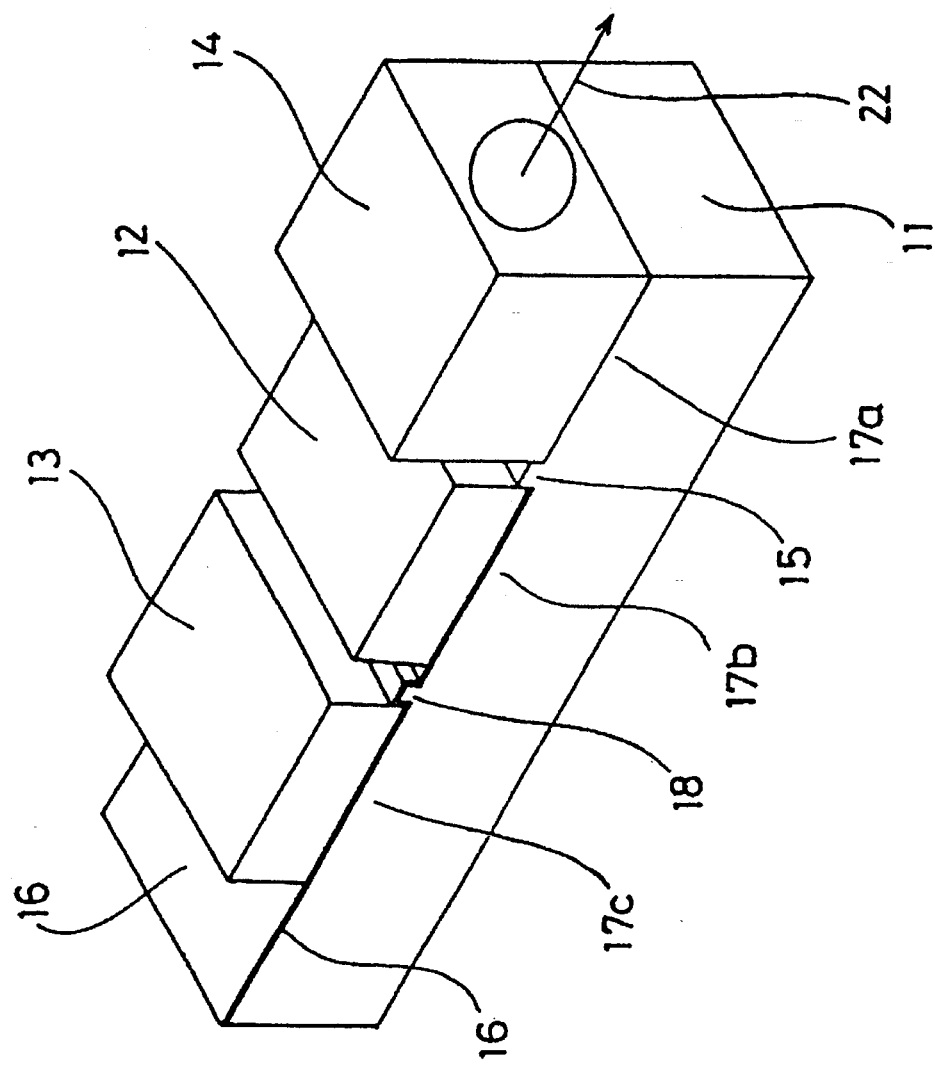
FIG. 2 is a perspective view illustrating a semiconductor laser device cut and separated according to the first embodiment of FIG. 1.
Figure 3A:
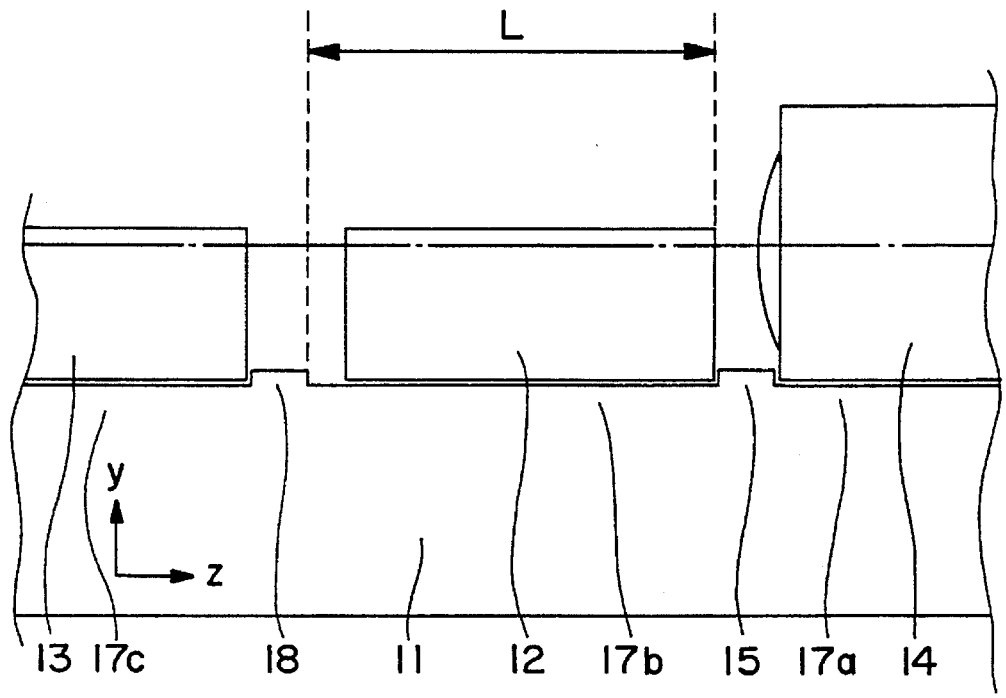
FIGS. 3(a) and 3(b) are respectively a side view and a cross-sectional view illustrating a semiconductor laser array device according to the first embodiment of the present invention.
Figure 3B:
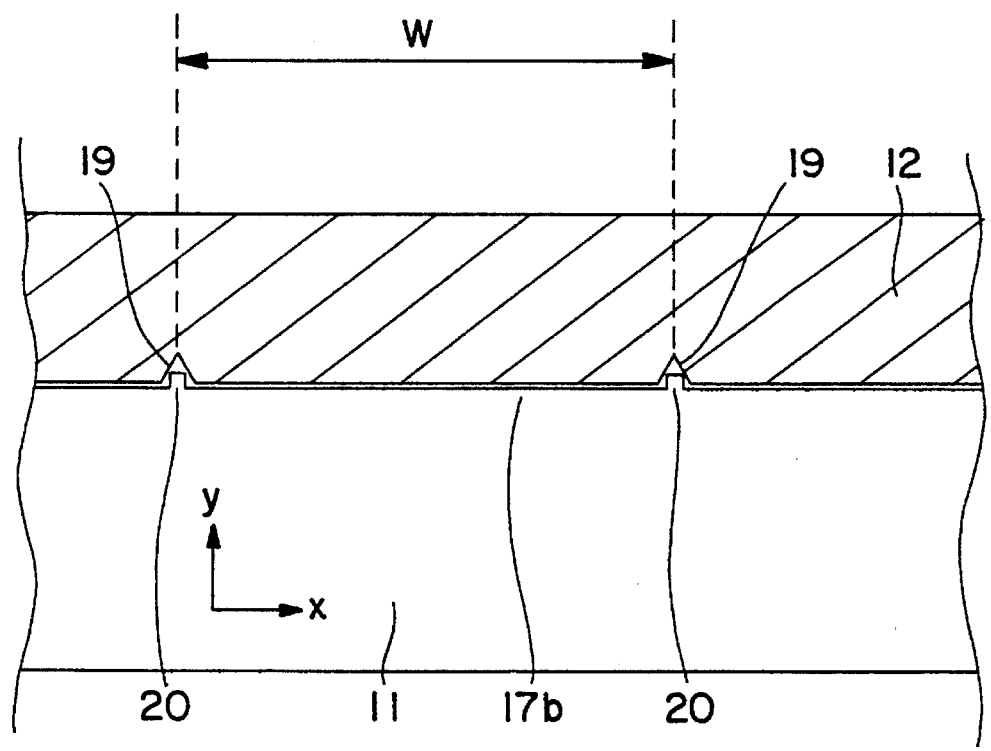
Figure 4:
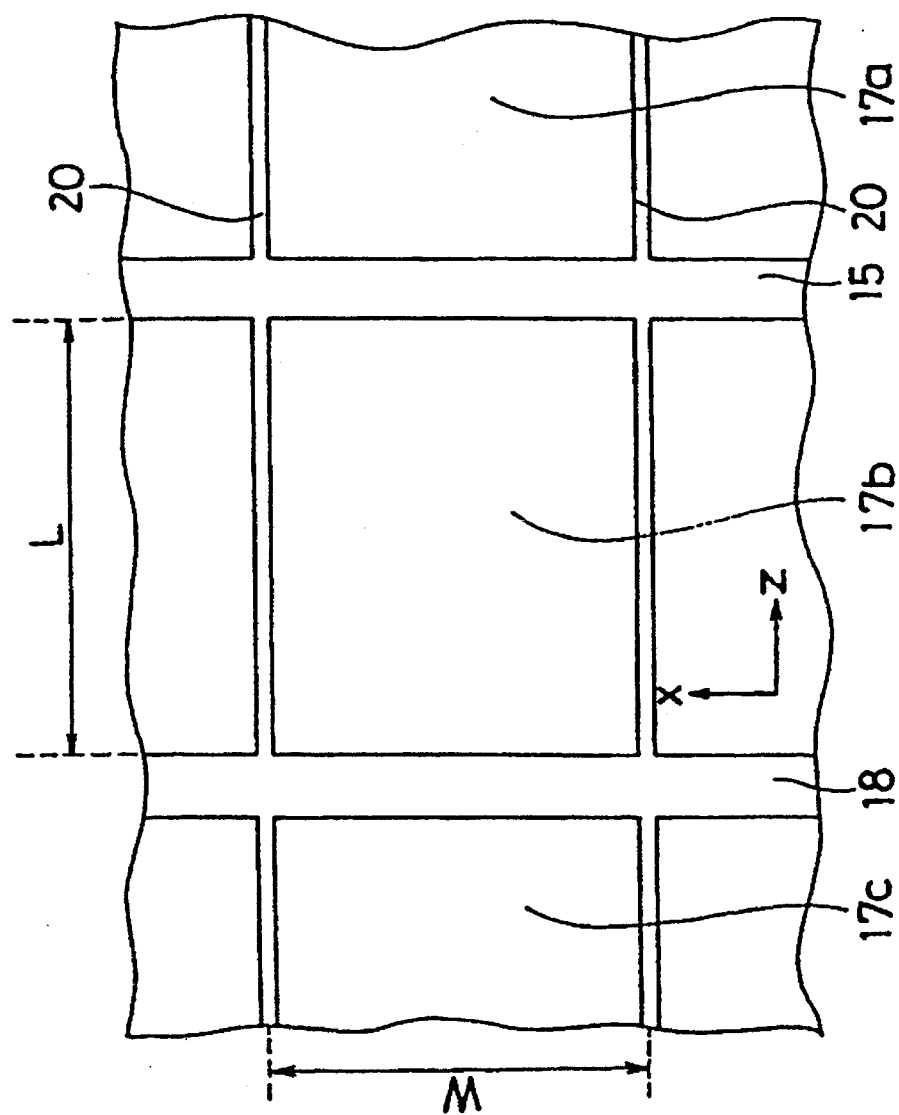
FIG. 4 is a plan view illustrating a supporting substrate of a semiconductor laser array device according to a first embodiment of the present invention.

FIG. 1 is a perspective view illustrating a semiconductor laser array device according to a first embodiment of the present invention, FIG. 2 is a perspective view illustrating a semiconductor laser device cut and separated from the semiconductor laser array device of FIG. 1, FIG. 3(a) is a side view of the semiconductor laser array device of FIG. 1 viewed from the x direction, FIG. 3(b) is a cross-sectional view of the semiconductor laser array device of FIG. 1 in the length direction thereof, and FIG. 4 is a plan view of the silicon substrate viewed from above.

In these figures, a silicon substrate 11 having a length in the length direction exceeding 20 mm, a thickness of 30–100 μm, and a width of 1.2–1.5 mm is provided. A semiconductor laser chip array 12 having a length in the length direction exceeding 20 mm, a height of 100 μm, and a width of 200–500 μm is arranged on the silicon substrate 11. A monitor photodiode array 13 having a length in the length direction exceeding 20 mm, a height of 100 μm, and a width of 200–500 μm is arranged on the silicon substrate 11. A lens array 14 having a length in the length direction exceeding 20 mm, a height of 200 μm, and a width of 250–500 μm is arranged on the silicon substrate 11. A position-determining projection 15 for determining the position of the semiconductor laser chip array and the lens array and having a height of 2–5 μm and a width of 10–50 μm is provided on the silicon substrate 11 in a striped shape. An electrode 16 comprising a thin metal film connects the bottom of the semiconductor laser chip 12 and the bottom of the monitor photodiode 13. A first groove 17a having a width of 100–500 μm is produced for placing and adhering the lens array 14 to the silicon substrate 11. A second groove 17b having a width of 210–550 μm is used for placing and adhering the semiconductor laser chip array 12 to the silicon substrate 11. A third groove 17c having a width of 500–1000 μm is used for placing and adhering the monitor photodiode 13 to the silicon substrate 11. A projection 18 having a height of 2–5 μm, a width of 10–50 μm, and a striped shape is formed on the silicon substrate 11 for determining the position of the monitor photodiode array. Grooves 19 for position determination having a depth of 4–10 μm and a width of 5–10 μm are formed at the semiconductor laser chip array 12, the monitor photodiode array 13, and the lens array 14, respectively. Projections 20 having a height of 2–5 μm and a width of 2–5 μm and engaged with the grooves 19 are formed on the silicon substrate 11 for position determination of the semiconductor laser chip array 12, the monitor photodiode array 13, and the lens array 14 in the length direction. Dicing lines 21, separating lines, are produced on the semiconductor laser chip array 12, the monitor photodiode array 13, and the lens array 14, respectively, for cutting and separating elements into constitutional units after positioning and adhering the semiconductor laser chip array 12, the monitor photodiode array 13, and the lens array 14, respectively, to the silicon substrate 11. Reference numeral 22 designates a laser beam emitted from the light emitting point of a semiconductor laser chip 12.

The semiconductor laser chip wafer is separated into portions along a laser resonator length by cleaving whereby bar-shaped semiconductor laser chip arrays 12, each array including a plurality of semiconductor laser chips 12a, having the same chip width and arranged in an array in the width direction, are produced.

Thereafter, the monitor photodiode wafer is cut and separated into portions of a laser array length by cleaving similar to the semiconductor laser chip arrays 12, whereby bar-shaped monitor photodiode arrays 13, each array including a plurality of monitor photodiodes 12a having the same chip width as that of the semiconductor laser chip array 12a and arranged in the width direction, are produced.

A plurality of lenses 14a are arranged on a straight line with the same period as that of the laser chip array and aligned with the chip width of the semiconductor laser chip array 12. A resin or the like is placed between the lenses whereby a bar-shaped lens array 14 is produced.

Grooves 19 for position determination are formed by etching the semiconductor laser chip array 12, the monitor photodiode array 13, and the lens array 14, respectively, and electrodes (not shown) are formed at the semiconductor laser chip array 12 and the monitor photodiode array 13, respectively.

Then, a bar-shaped silicon substrate 11 for mounting the semiconductor laser chip array 12, the monitor photodiode array 13, and the lens array 14 are produced by cleaving. The substrate 11 is etched employing a resist mask, thereby producing a projection 15 and forming the first and second grooves 17a and 17b, for determining the positions of the semiconductor laser chip array 12 and the lens array 14 relative to each other, and a projection 18, thereby forming the third groove 17c for determining the position of the monitor photodiode array 12. In addition, the projections 20 for determining the position of the semiconductor laser chip array 12, the monitor photodiode array 13, and the lens array 14 are formed on the substrate 11 extending in a direction perpendicular to the length direction and, thereafter, a metal thin film electrode 16, the electrode for the semiconductor laser chip 12 and for the monitor photodiode 13, is formed by CrAu evaporation.

Next, the semiconductor laser chip array 12 is pushed against the projection 15 for determining the position of the semiconductor laser chip array and the lens array so that the laser chip array is in contact with the projection 15 and the array position-determining projections 20 and the position-determining grooves 19 of the laser array 12 are engaged with each other to position the array 12 whereby the array 12 is placed at a desired position in the groove 17b on the silicon substrate 11. Thereafter, soldering with AuSn or the like adheres the array 12 to the groove 17b. Then, the rear face of the semiconductor laser chip array 12 is spaced from the front face of the position-determining projection 18 for the monitor photodiode array 13 by about several tens of microns.

Thereafter, the monitor photodiode array 13 is pushed into contact with the projection 18 for determining the position of the monitor photodiode array so that the projections 20 for array position determination and the grooves 19 for position determination of the array 13 are engaged with each other. Thereby, the array 13 is aligned and arranged at a desired position in the third groove 17c on the silicon substrate 11. Soldering with AuSn or the like fixes the monitor photodiode array 13 to the third groove 17c. Because the monitor photodiode array 13 monitors the output light from the semiconductor laser chip array 12, the emitting facet of the semiconductor laser chip array 12 and the input facet of the monitor photodiode array 13 are aligned with each other. The second groove 17b, the position-determining projection 18 for the monitor photodiode array, and the third groove 17c on the silicon substrate 11 are covered with a CrAu film and an external electrode 16 common to the semiconductor laser chip 12 and the monitor photodiode array 13 is located at a part of the third groove 17c that is not contacted by the monitor photodiode array 13.

Thereafter, the lens array 14 is pushed against the projection 15 for position determination between the semiconductor laser chip array and the lens array, opposite the semiconductor laser chip array 12. The projections 20 for array position determination and the grooves 19 for position determination of the lens array 14 engage each other whereby the lens array 14 is aligned at a desired position in the first groove 17a on the silicon substrate 11. Thereafter, soldering using AuSn or the like or adhesion employing a polyimide adhesive or the like is used to attach the lens array 14 to the first groove 17a. The width of the projection 15 for relative position determination of the semiconductor laser chip array and the lens array is set so that the light emitting part of each semiconductor laser chip 12 is positioned at the focal point of a corresponding lens 14. In this way, a bar-shaped semiconductor laser array device having a plurality of semiconductor laser devices, each device including a semiconductor laser chip 12a, a monitor photodiode 13a, and a lens 14a having aligned optical axes is produced as shown in FIG. 1.

Then, the completed semiconductor laser array device, in an array state, is cut employing a dicing blade and separated into individual semiconductor laser devices, thereby producing a plurality of the semiconductor laser devices shown in FIG. 2. The width of the dicing blade is 15–20 µm and the width cut by that dicing blade is 20–25 µm, a dimension preferably considered in designing the array.

In the production of the semiconductor laser array device of this first embodiment, it is required to arrange the semiconductor laser chip array 12, the monitor photodiode array 13, and the lens array 14 on the silicon substrate 2, position-aligning those elements in the z axis direction, i.e., the direction in which the laser light is emitted, in the x axis direction, i.e., the length direction of the silicon substrate 11, and in the y axis direction, i.e., the height direction of the silicon substrate 11.

First of all, the position alignment along the z axis direction, i.e., the direction in which the laser light is emitted will be described. As shown in FIG. 3(a), the semiconductor laser array 12, the monitor photodiode array 13, and the lens array 14 are mounted on the bar-shaped silicon substrate 11. A stripe-shaped position-determining projection 15 for relative position determination of the semiconductor laser chip array and the lens array is formed on the silicon substrate 11 in the length direction of the substrate and the lens array 14 is pushed toward this position determination projection 15 to fix the lens array 14 in the first groove 17a. The semiconductor laser array is similarly pushed toward the projection 15, thereby fixing the semiconductor laser array 12 in the second groove 17b whereby the distance between the semiconductor laser 12a and the lens 14a is determined.

The monitor photodiode array 13 is pushed against the position determination projection 18 for the monitor photodiode array opposite the rear end of the semiconductor laser chip array 12, similar to the position determination projection 15 for position determination between the semiconductor laser chip array and the lens array. In FIG. 3(a), reference character L represents a distance between the position determination projection 15 for relative position determination of the semiconductor laser chip array and the lens array and the position determination projection 18 for determining the position of the monitor photodiode array. Here, the distance is 260–550 µm.

Next, position alignment in the x direction, i.e., the length direction of the silicon substrate 11 will be described. FIG. 3(b) shows a cross-sectional view that is obtained when the silicon substrate 11 and the semiconductor laser array 12 adhered to the substrate 11 are cut in a plane parallel to the x-y plane. In the figure, reference character W represents the width of one chip of the semiconductor laser chip array 12, and is 200–500 µm. The semiconductor laser chip array 12 comprises a plurality of chips of the same structure having a period of width W. The monitor photodiode array 13 and the lens array 14 have the same period.

A position determination groove 19 having a striped shape and a reverse V shape in cross-section is provided at the rear surface of the semiconductor laser chip array 12 for each chip width W in a direction perpendicular to the length direction of the semiconductor laser chip array 12. On the contrary, a stripe-shaped position determination projection 20 is provided in a direction perpendicular to the length direction of the silicon substrate 11 engaged with the position-determining groove 19 of the array 12. Therefore, by engaging the position-determining groove 19 of the array 12 with the stripe-shaped determination projection 20 on the silicon substrate 11, the relative positions of the semiconductor laser chip array 12 and the silicon substrate 11 in the x axis direction in FIG. 1 are determined whereby the optical axes of the respective elements are aligned with each other.

Similarly, the monitor photodiode array 13 and the lens array 14 having a period having position-determining grooves 19 similar to those in the semiconductor laser chip array 12. By engaging these position-determining grooves 19 and the projections 20 on the silicon substrate 11, the semiconductor laser chip array 12, the monitor photodiode array 13, and the lens array 14 having the same chip width W are position-aligned in the length direction on the silicon substrate 11.

Position alignment in the y axis direction, i.e., the height direction of the silicon substrate 11, will be described.

As shown in FIG. 3(a), in order to align the optical axes in the y axis direction, it is only required that the distance from the bottom of the lens array 14 to the optical axis of the lens be equal to the distance from the bottom of the semiconductor laser array 12 to the light emitting points thereof.

In this way, the optical axes of the lens array 14, the semiconductor laser array 12, and the monitor photodiode array 13 are aligned and the distances therebetween are held at desired values.

In addition, by producing the semiconductor laser array 12 including several tens of semiconductor laser chips, the monitor photodiode array 13 including several tens of monitor photodiodes, the lens array 14 including several tens of lenses, and the bar-shaped silicon substrate 11, forming position-determining grooves 19 in the arrays 12, 13, and 14, position-determining projections 15, 18, and 20 and grooves 17a, 17b, and 17c in the substrate 11, aligning the arrays 12, 13, and 14 with the projections 15, and 18 and the grooves 19 with the projections 20, and adhering the arrays to the substrate 11, optical axis alignment of all of the several tens of semiconductor laser devices is performed at once, thereby greatly improving efficiency relative to the prior art method in which the spherical lens 4 and the monitor photodiode array 3 are aligned and adhered one-by-one for each semiconductor laser chip.

In order to separate the bar-shaped semiconductor laser array device units, each unit comprising a monitor photodiode chip, a semiconductor laser chip, and a lens, it is only required to dice the laser array device along the separating lines 21 shown in FIG. 1 by employing a dicing blade.

The depth of the reverse V-shaped position-determining grooves 19 in the semiconductor laser chip array 12, the monitor photodiode array 13, and the lens array 14 is about 4–10 µm and the height of the position-determining projections 20 on the silicon substrate 11 is about 2–5 µm. Further, U-shaped grooves 19 are preferable to the V-shaped grooves because the wafer having the former is more difficult to break.

Figure 5A:
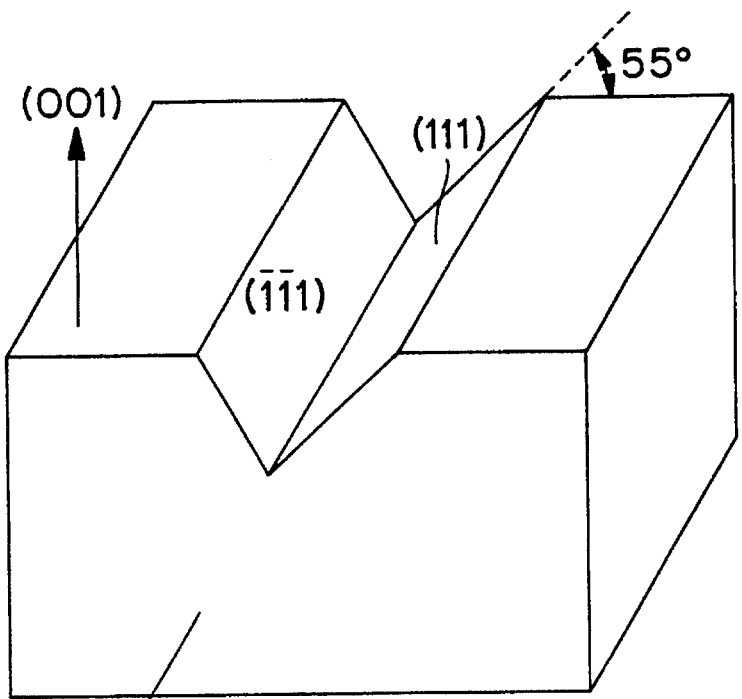
FIGS. 5(a) and 5(b) are, respectively, a view illustrating a V-shaped groove and a U-shaped groove on an InP supporting substrate.

The grooves 19 for position determination are described with reference to FIG. 5(a). FIG. 5(a) shows the V-shaped groove 19 produced on the InP supporting substrate. The V-shaped groove 19 running in the (010) direction on the InP supporting substrate having a (001) main surface, as shown in the figure, is produced by etching employing a solution having a composition of HBr: $H_2O_2$ = 1:1 at 25° C. Etching comprises immersing the InP supporting substrate in the etchant, while stirring the solution, for one minute.

Figure 5B:
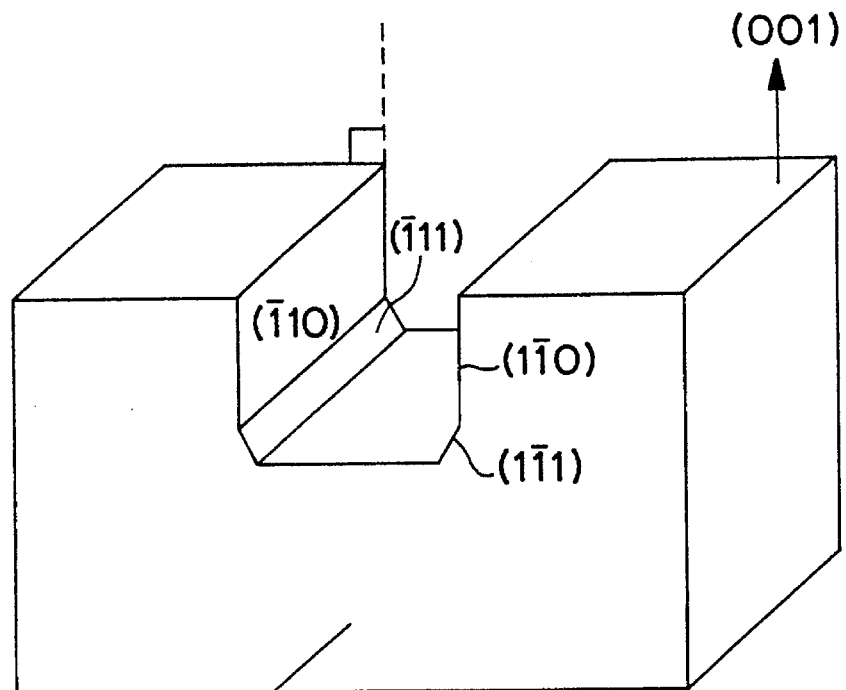

FIG. 5(b) shows a U-shaped groove 19 produced on an InP substrate. The U-shaped groove 19 running in the (110)

direction on the InP substrate having a (110) main surface, as shown in the figure, is produced by etching employing a solution of HCl at 25° C. Etching comprises immersing the InP supporting substrate in the etchant, while stirring the solution, for one minute.

While the projections 15, 18, and 20 on the silicon substrate 11 shown in FIG. 4 are produced by etching the silicon substrate 11, they may be produced by a thick plating, such as gold, when metallizing the surface of the silicon substrate 11. The grooves 19 for position determination in the semiconductor laser chip array 12, the monitor photodiode array 13, and the lens array 14 and the projections 15, 18, and 20 on the substrate 11 can be produced at precise positions and with precise dimensions using conventional photolithography techniques.

In the above-described first embodiment, grooves 19 for position determination are produced in the semiconductor laser chip array 12 comprising plural semiconductor laser chips, the monitor photodiode array 13 comprising plural monitor photodiode chips, and the lens array 14 comprising plural lenses, the projections 15, 18, and 10, and the grooves 17a, 17b, and 17c for position determination are produced on the bar-shaped silicon substrate 11, the arrays 12, 13, and 14 are pushed toward the projections 15 and 18, and the grooves 19 of the arrays 12, 13, and 14 and the projections 20 of the substrate are engaged with each other, whereby the substrate 11 and the arrays 12, 13, and 14 are aligned and fixed in place. After the semiconductor laser array device is thus produced, it is separated into individual semiconductor laser devices by dicing, whereby efficiency and productivity are greatly improved.

EMBODIMENT 2

Figure 6:
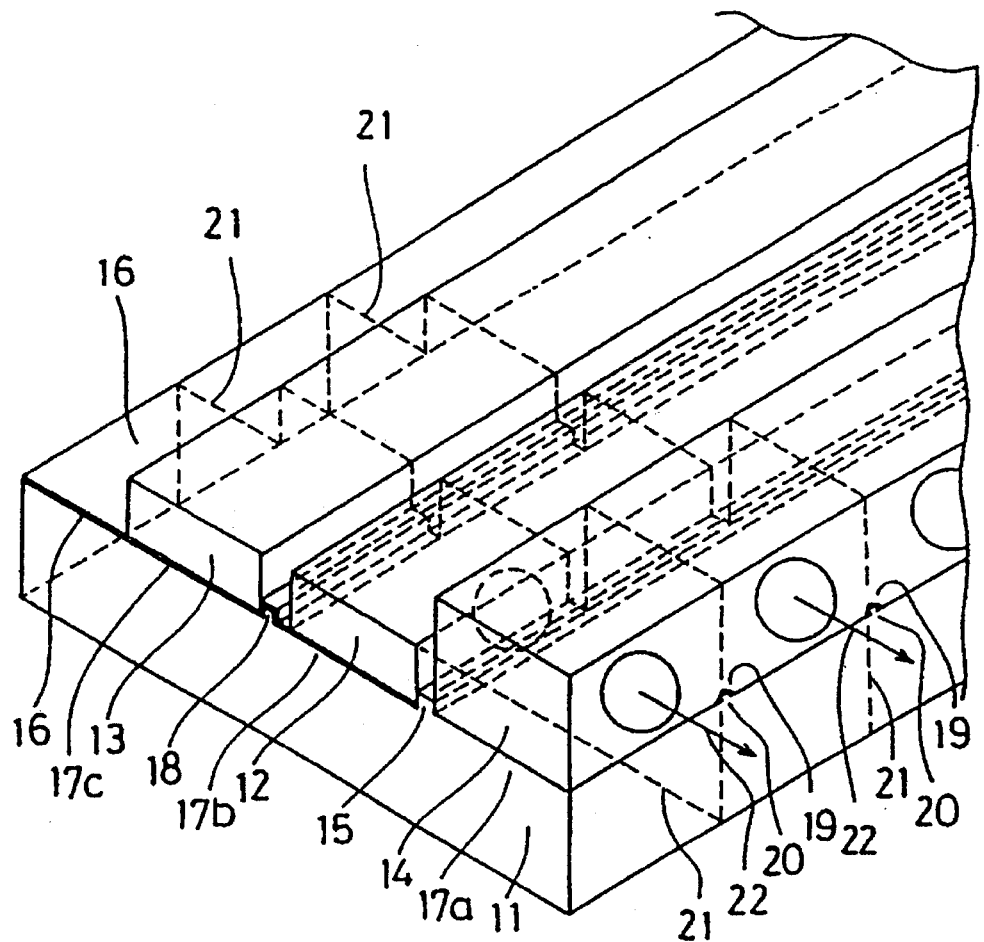
FIG. 6 is a perspective view illustrating a semiconductor laser array device according to a second embodiment of the present invention.

FIG. 6 is a perspective view illustrating a semiconductor laser array device according to a second embodiment of the present invention. While, in the above-described first embodiment, the projections 20 for position determination on the bar-shaped silicon substrate 11 have a period W, in this second embodiment, at least one projection 20 for position determination is provided for a length of n× W, which is a length in the length direction of the array. A groove 19 for position determination to be engaged with the projection 20 for position determination is provided on each of the semiconductor laser chip array 12, the monitor photodiode array 13, and the lens array 14, respectively. Here, n designates the number of the chips.

As described above, in this second embodiment, at least one set of the position-determining grooves 19 and the position-determining projections 20 are provided on the arrays 12, 13, and 14 and on the grooves 17a, 17b, and 17c on the supporting substrate 11, respectively, whereby the position determination in the length direction of the arrays 12, 13, and 14 and in the length direction of the substrate 11 can be performed with the same effects as obtained in the first embodiment.

EMBODIMENT 3

Figure 7:
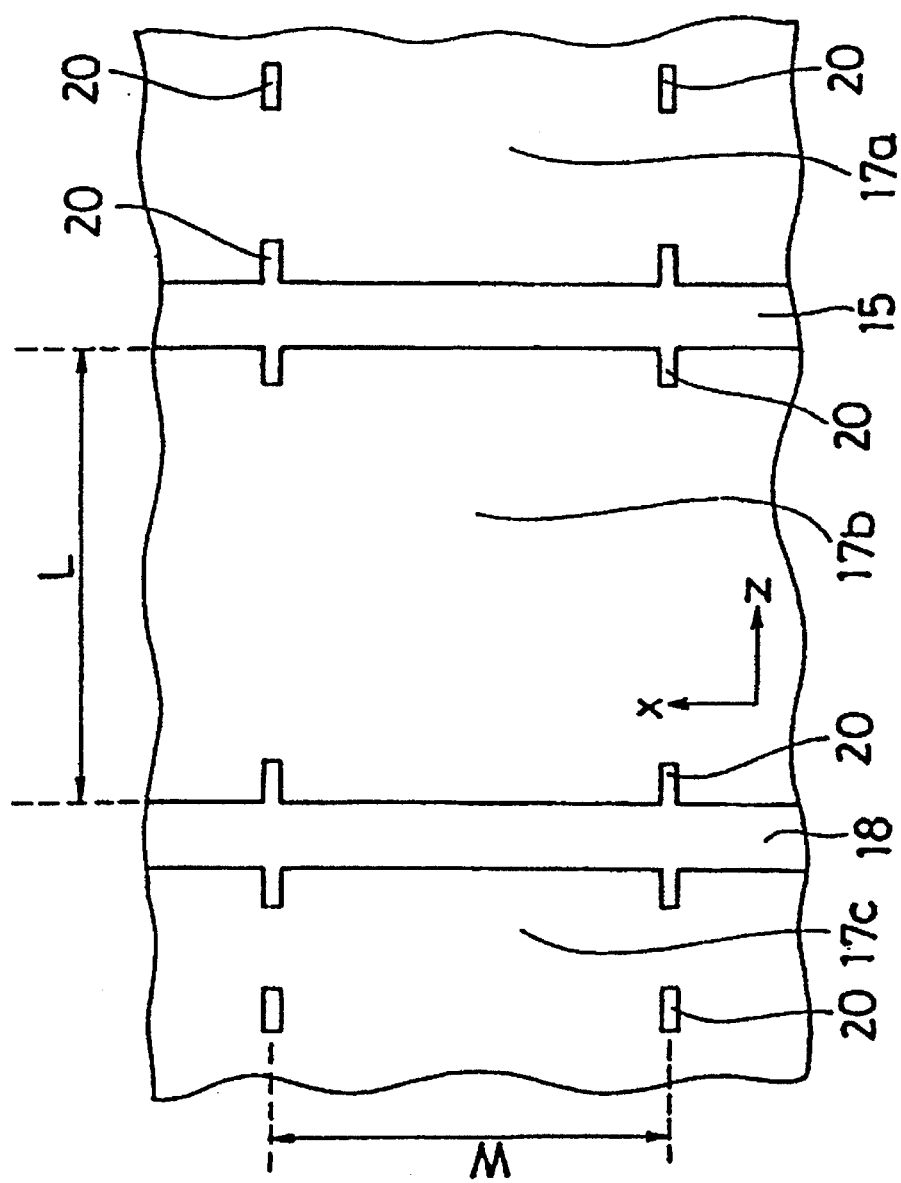
FIG. 7 is a plan view illustrating a supporting substrate of a semiconductor laser array device according to a third embodiment of the present invention.

FIG. 7 is a plan view illustrating a semiconductor laser array device according to a third embodiment of the present invention. While, in the above-described first embodiment, the projections 20 for position determination with the grooves 17 on the silicon substrate 11 are provided along the entire length of the attaching portion of the semiconductor array 12, in this third embodiment, the projections are provided at portions of the groove 17, as shown in FIG. 7.

This arrangement is not only used for the groove 17b for fixing the semiconductor laser chip array 12 but can also be used with all of the grooves 17a, 17b, and 17c, respectively, for mounting the semiconductor laser chip array 12, the monitor photodiode array 13, and the lens array 14, respectively.

As described above, in this third embodiment, by producing the projections 20 for position determination in portions of the grooves 17a, 17b, and 17c on the supporting substrate 11, for engagement with the grooves 19 in the semiconductor laser chip array 12, the monitor photodiode array 13, and the lens array 14, position determination in the length direction of the arrays 12, 13, and 14 and the silicon substrate 11 can be achieved with the same effects as described above.

EMBODIMENT 4

In the above-described first embodiment, the grooves 19 for position determination are formed on the semiconductor laser chip array 12, the monitor photodiode array 13, and the lens array 14, and the projections 20 for position determination are formed on the silicon substrate 11 but, in this fourth embodiment, the projections 20 for position determination are formed on the arrays 12, 13, and 14 and the grooves 19 for position determination are formed in the silicon substrate 11.

As described above, in this fourth embodiment, the projections 20 for position determination are produced in the semiconductor laser chip array 12, the monitor photodiode array 13, and the lens array 14 and the grooves 19 for position determination to be engaged with the projections for position determination are respectively produced in the grooves 17a, 17b, and 17c whereby position determination in the length direction of the arrays 12, 13, and 14 and the substrate 11 can be performed with the same results as described above.

EMBODIMENT 5

FIGS. 12(a)–12(c) show perspective views illustrating a process for producing the semiconductor laser chip array device according to a fifth embodiment of the present invention. In the figures, the same reference numerals as those in FIG. 1 designate the same or corresponding elements. Reference numeral 51 designates a spherical lens having a diameter of 200 μm~1.0 mm and reference numeral 50 designates a hollow having a shape of, for example, a rectangle, viewed from above, for receiving the spherical lens 51.

While in the above-described first embodiment, the lens array 14 is employed as a lens, the spherical lens 51 may be employed as this lens. For example, hollows 50, each for receiving a spherical lens 51, are formed at positions equivalent to those of the lenses of the first embodiment and the spherical lenses 51 are fixed in the hollows 50.

As shown in FIG. 12(a), the semiconductor laser chip array 12, the monitor photodiode array 13, and the lens array 51 are produced.

Figure 13A:
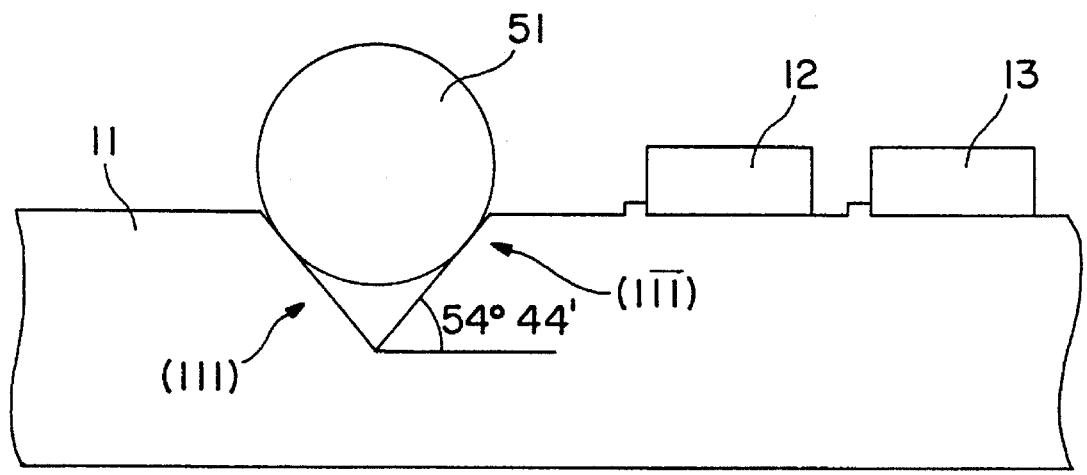
FIGS. 13(a) and 13(b) are cross-sectional views illustrating configurations of hollows produced according to the fifth embodiment of the present invention.
Figure 13B:
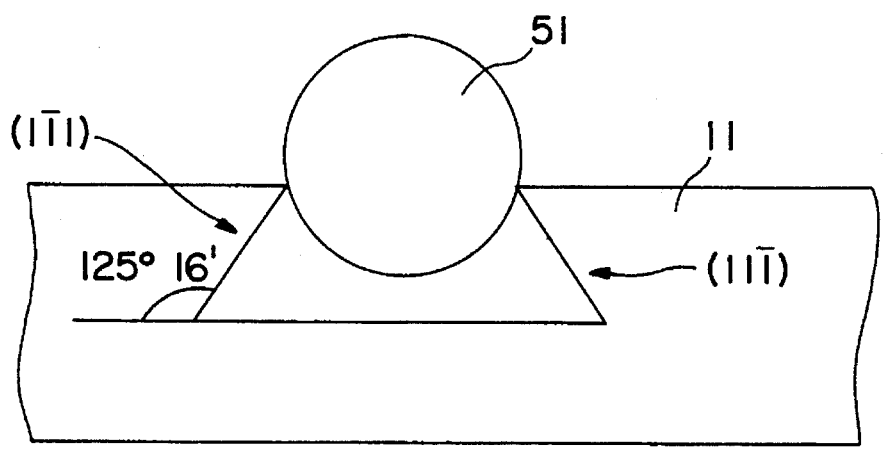

The grooves 19 for position determination are formed on the semiconductor laser chip array 12 and the monitor photodiode array, the projections 15, 18, and 20 and the grooves 17a, 17b, and 17c for position determination are produced on the bar-shaped silicon substrate 11, and hollows 50, each for receiving a spherical lens 51, are produced at the groove 17a (FIG. 12(b)). This hollow 50 is produced by wet etching the silicon substrate 11 employing KOH. FIG. 13(a)

shows a cross-section in the optical axis direction of the laser chip 12 of this hollow 50 and FIG. 13(b) shows a cross-section in the length direction of the supporting substrate. When the supporting substrate 11 having a (100) surface is anisotropically etched with KOH, (111) and (1$\bar{1}\bar{1}$) surfaces are exposed along the optical axis direction of the laser chip, and a V-shaped groove as shown in FIG. 13(a). (1$\bar{1}$1) and (11$\bar{1}$) surfaces are exposed along the length direction of the supporting substrate 11 and the etched width becomes wider with depth, as shown in FIG. 13(b). The shape of the hollowed portion seen from above the supporting substrate 11 may be of any shape that can hold the spherical lens 51 at a predetermined position.

After pushing the arrays 12 and 13 against the projections 15 and 18 and engaging the grooves 19 of the arrays 12 and 13 with the projections 20 of the supporting substrate, the supporting substrate 11 and the arrays 12 and 13 are soldered and fixed in place with AuSn solder or the like, thereby determining the position of the supporting substrate 11 and the arrays 12 (FIG. 12(c)).

The spherical lenses 51 are fixed to and engaged with the hollows 50 with a polyimide adhesive, thereby producing the semiconductor laser array device shown in FIG. 12(d). The device is separated into individual semiconductor laser devices as shown in FIG. 12(e). In this method, the arrangement of the spherical lenses 51 can be performed relatively easily and productivity is high relative to the prior art.

As described above, in this fifth embodiment, the spherical lenses 51 can be employed in place of the lens array 14 and production of many semiconductor laser devices can be performed easily. Therefore, work efficiency is increased and productivity is greatly improved.

EMBODIMENT 6

Figure 14A:
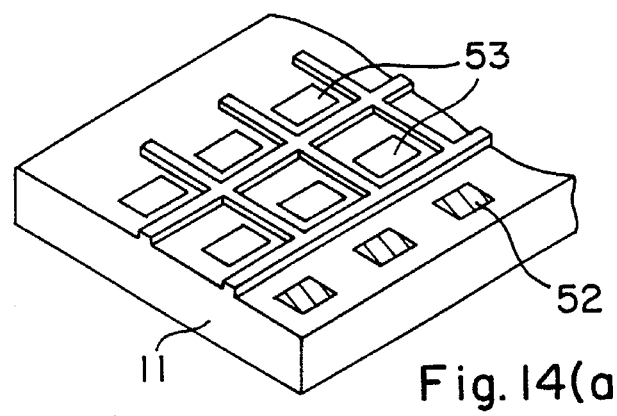
FIGS. 14(a) through 14(d) are diagrams illustrating steps in the production process of a semiconductor laser device according to a sixth embodiment of the present invention.
Figure 14B:
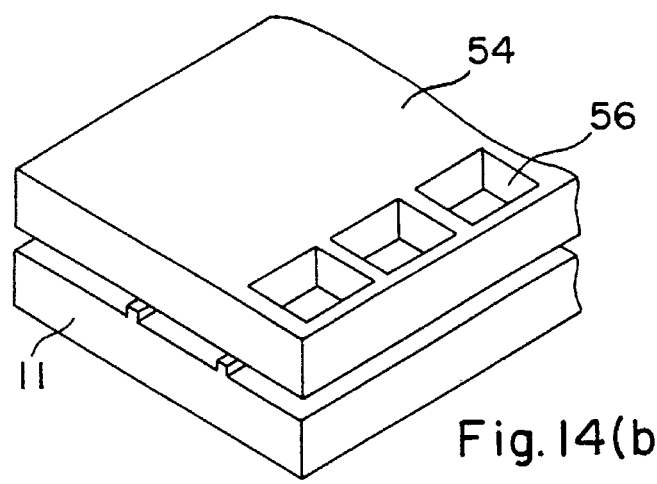
Figure 14C:
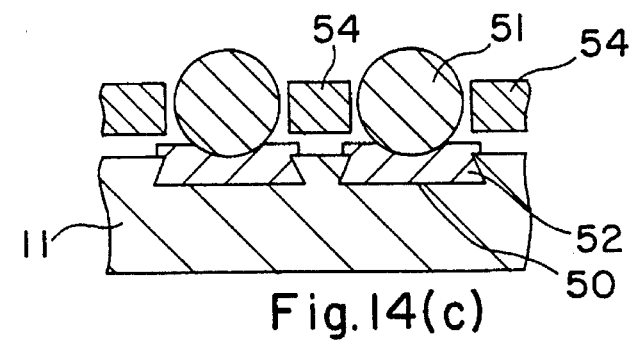
Figure 14D:
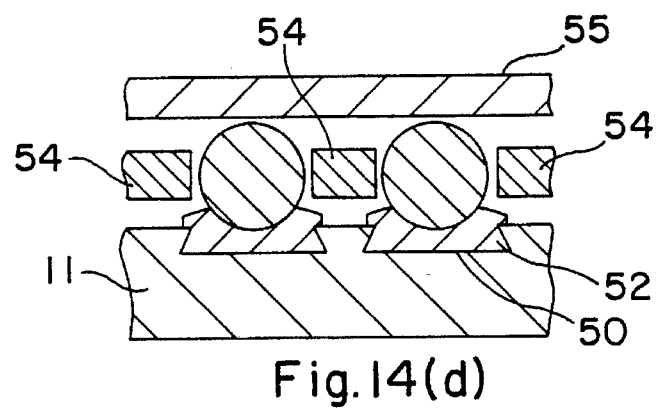

FIGS. 14(a) and 14(b) are perspective views showing steps for position determination of the lenses in the production of a semiconductor laser array device according to a sixth embodiment of the present invention and FIGS. 14(c) and 14(d) are cross-sectional views in the length direction of the supporting substrate, respectively. In the figures, the same reference numerals as those in FIGS. 12(a)–12(e) designate the same or corresponding elements. Reference numeral 52 designates a polyimide adhesive layer screen printed on the hollows 50 in the silicon substrate 11. Reference numeral 53 designates solder, such as AuSn, formed by evaporation. Reference numeral 54 designates a sieve member having a size, viewed from above, approximately equal to that of the substrate 11 and a thickness less than the diameter of the lens 51. Holes 56 of a rectangular shape which can pass the lenses 51 are arranged with the same period as that of the laser chips of the semiconductor laser chip array 12. For example, when the diameter of the spherical lens 51 is 200 μm, the thickness of the sieve member 54 is equal to or below 200 μm and the configuration of the hole 56 is a rectangle having an edge larger than 200 μm. Here, the configuration of the hole 56 may be any configuration that can pass the spherical lens 51. Reference numeral 55 designates a pushing member for putting the lenses 51 into the hollows 50.

While, in the above-described embodiment, it is necessary to position determine and set the spherical lenses 51 one-by-one, in this sixth embodiment the position determination and setting of the plural lenses 51 occurs simultaneously, thereby producing a semiconductor laser array device.

As shown in FIG. 12(a), the semiconductor laser array 12, the monitor photodiode array 13, and the spherical lenses 51 are produced, the grooves 19 for position determination are produced in the semiconductor laser chip array 12 and the monitor photodiode array 13, the projections 15, 18, and 20, and the grooves 17a, 17b, and 17c for position determination are produced on the bar-shaped silicon substrate 11, and the hollows 50 for receiving the spherical lenses 4 are produced at the grooves 17a.

Thereafter, as shown in FIG. 14(a), solder 53 for attaching the semiconductor laser chip array 12 and the monitor photodiode array 13 to the grooves 17n and 17c is produced by evaporation and an adhesive layer 52 is produced at the hollows 50 by screen printing (FIG. 12(a)).

Next, as shown in FIG. 14(b), a sieve member 54 is placed on the supporting substrate 11 so that the positions of the hollows 50 and the positions of the holes 56 are aligned and a plurality of spherical lenses 51 are put in and engaged with the hollows 50, as shown in FIG. 14(c). Further, as shown in FIG. 14(d), the spherical lenses 51 are pushed from above the sieve member 54 by pushing member 55, thereby setting and fixing in place a plurality of spherical lenses 51 simultaneously.

Thereafter, the pushing member 55 and the sieve member 54 are removed, the ends of the arrays 12 and 13 are pushed against the projections 15 and 16, the grooves 19 of the arrays 12 and 13 and the projections 20 of the supporting substrate are engaged with each other, and the supporting substrate 11 and the arrays 12 and 13 are aligned with each other and are fixed by solder, thereby producing a semiconductor laser chip array device. Thereafter, the device is separated into individual semiconductor laser devices (FIG. 12(e)).

If the sieve member 54 is employed, it is also possible to determine the position of the lenses 51 in the length direction of the supporting substrate 11. Therefore, it is possible to fix the lenses 51 at predetermined positions by providing a stripe-shaped V-shaped groove extending in the length direction of the supporting substrate 11 in place of the hollow 50 and arranging the lenses in this V-shaped groove.

In this embodiment, a plurality of spherical lenses 51 can be arranged at predetermined positions, i.e., at the hollow 50, simultaneously, determining their positions, and, therefore, there is no necessity of determining the position for each spherical lens 51 as in the sixth embodiment. Therefore, it is possible to easily arrange the plurality of lenses 51 at predetermined positions on the substrate 11 and it is also possible to improve productivity.

In addition, it is possible to deposit the adhesive layer 52 for fixing the spherical lenses 51 to the supporting substrate 11 by screen printing with high positional precision and, therefore, it is possible to arrange the adhesive layer easily and in a short time. It is also possible to avoid faults in the fixation of the lenses due to positional deviation of the adhesive layer, thereby greatly improving production yield.

EMBODIMENT 7

Figure 15:
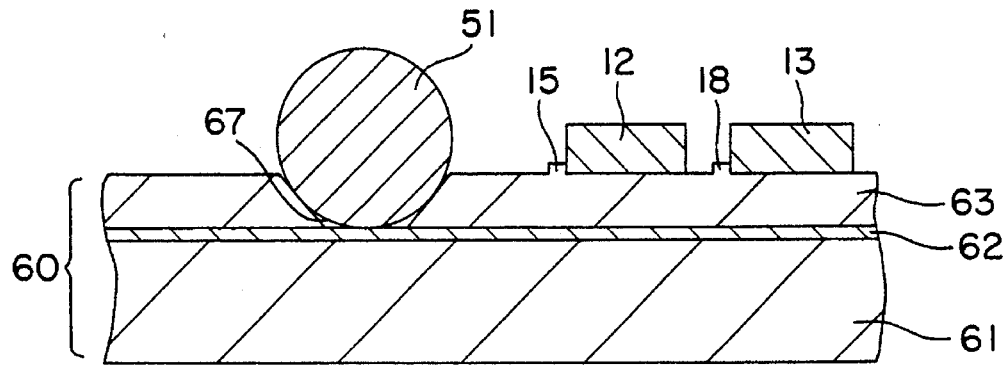
FIG. 15 is a cross-sectional view illustrating a structure of a semiconductor laser device according to a seventh embodiment of the present invention.

FIG. 15 is a cross-sectional view along the optical axis direction of the semiconductor laser chip array illustrating a structure of the semiconductor laser device according to a seventh embodiment of the present invention. In the figure, the same reference numerals as those in FIGS. 12(a)–12(e) designate the same or corresponding elements. Reference numeral 60 designates a supporting substrate including an etch stopping layer 62 several microns thick and a silicon layer 63 about 30 μm thick successively on the silicon substrate 61. Reference numeral 67 designates a hollow in the supporting substrate 60.

Figure 16A:
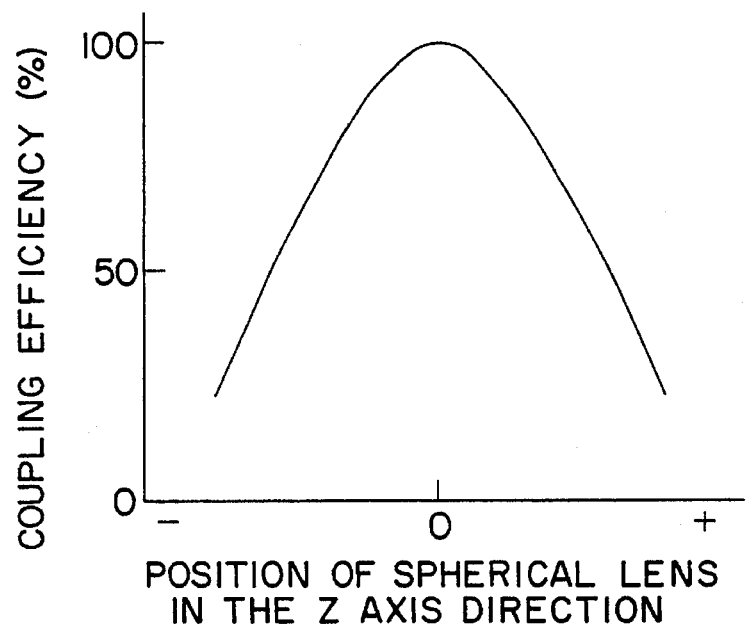
FIGS. 16(a) and 16(b) are diagrams for explaining the relationship of the coupling efficiency between a spherical lens and a laser chip of a semiconductor laser device with the position of the spherical lens along two axes according to the seventh embodiment of the present invention.
Figure 16B:
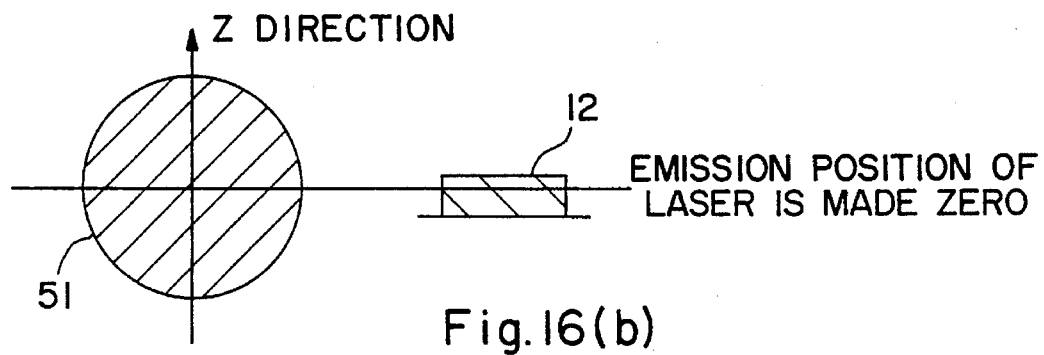

In the semiconductor laser device shown in the fifth and sixth embodiments, the cross-sectional configuration of the hollow 50 in the optical axis direction of the laser chip 12 has a V-shape, as shown in FIG. 13(a). The method for producing such a hollow 50 by masking and wet etching is an industrial method superior in workability, and in mass production. However, the width and depth of the hollow 50 lack reproducibility due to variations in the aperture width of the mask and errors in the control of etching. Therefore, the position of the spherical lens 51 in the height direction relative to the supporting substrate 11 varies and the coupling efficiency between the laser chip 12 and the spherical lens 51 is reduced, resulting in a reduction in the manufacturing yield of the semiconductor laser device. FIG. 16(a) shows a relationship between the position of the spherical lens 51 in the z axis direction and the coupling efficiency when the positions in the X and Y directions of the spherical lens 51 are fixed, and FIG. 16(b) shows a cross-sectional view in the optical axis direction of the laser chip showing the positional relationship between the spherical lens 51 and the laser chip 12.

This seventh embodiment is directed to solving such a problem and to controlling the position determination in the height direction of the lens 51 in the semiconductor laser device precisely with the etch stopping layer 62.

$B^+$ ions in a dose quantity of about $10^{15}$ $cm^{-2}$ are implanted in the p-type silicon substrate 61 having an impurity concentration of below $10^{14}$ $cm^{-3}$ and annealing is performed whereby an etch stopping layer 62 with a high concentration $p^+$-type layer having a dopant impurity concentration of $10^{19}$ –$10^{20}$ $cm^{-3}$ is formed on the silicon substrate 61. Then, a polycrystalline silicon layer of a predetermined thickness is formed thereon and annealing is performed at about 700° C. for recrystallization. A silicon layer 63 having the same dopant impurity concentration as that of the silicon substrate 61 is formed. In this way, a supporting substrate 60 with the etch stopping layer 62 at a predetermined position in the depth direction is produced. Next, a mask is produced on the surface of the supporting substrate 60 and wet etching is performed. If etching is performed employing KOH and the supporting substrate 60 has a (100) surface, anisotropic etching exposes a (111) surface and a (1$\bar{1}\bar{1}$) surface along the optical axis direction of the laser chip, and the silicon layer 63 is etched in a V-shaped configuration. When the etch stopping layer 62 as a high concentration $p^+$ layer is etched by the KOH, the etching speed is one-fiftieth of that of the silicon layer having a low impurity concentration. When a V-shaped hollow formed by the etching reaches the etch stopping layer 62, etching in the depth direction of the supporting substrate 60 is stopped and etching then proceeds in the optical axis direction of the laser chip 12 whereby a hollow 50 including the etch stopping layer 62 is produced. The etching is stopped when the aperture of this hollow 67 on the surface of the supporting substrate 60 reaches a predetermined size, and the laser chip arrays 12, the monitor photodiode arrays 13, and the lenses 51 are put in place, thereby producing a semiconductor laser array device.

The depth of the bottom of the hollow 67 formed by the etching is always the depth of the etch stopping layer 62 and, therefore, by etching so that a surface other than the bottom of the hollow 67 is not in contact with the lenses 51, the position of the lenses 51 relative to the depth direction of the supporting substrate 60 is always constant. In order to enhance the coupling efficiency between the laser chip 12 and the spherical lens 51, it is preferred to determine the height that produces the most appropriate coupling efficiency based on the diameter of the spherical lens 51 and to control the depth of the etch stopping layer 62, i.e., the thickness of the silicon layer 63 in accordance with that height.

As described above, since, in this embodiment, the supporting substrate 60 provided with the etch stopping layer 62 at a predetermined position in the depth direction is etched and etching is stopped by the etch stopping layer 62 to produce a hollow 67 and the spherical lens is placed in the hollow 67, the position of the lens 51 in the height direction of the supporting substrate 60 is determined with high reproducibility and precision.

EMBODIMENT 8

Figure 17A:
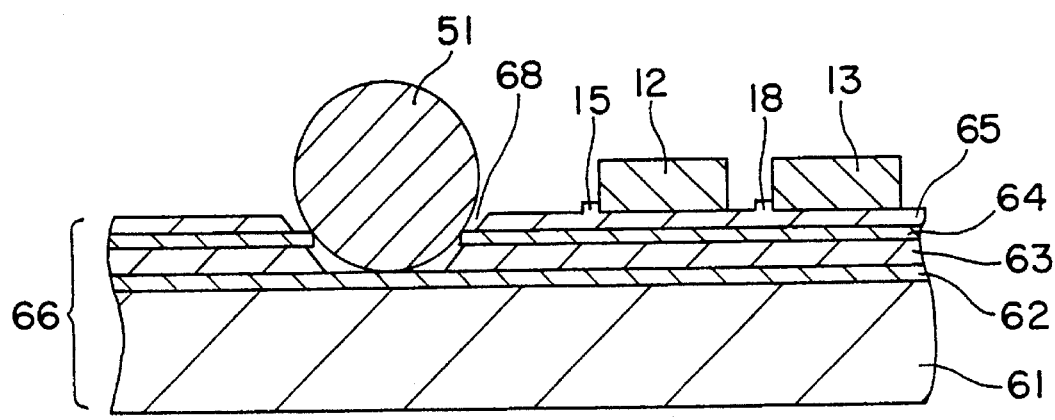
FIG. 17 is a cross-section view illustrating a structure of a semiconductor laser device according to an eighth embodiment of the present invention.
Figure 17B:
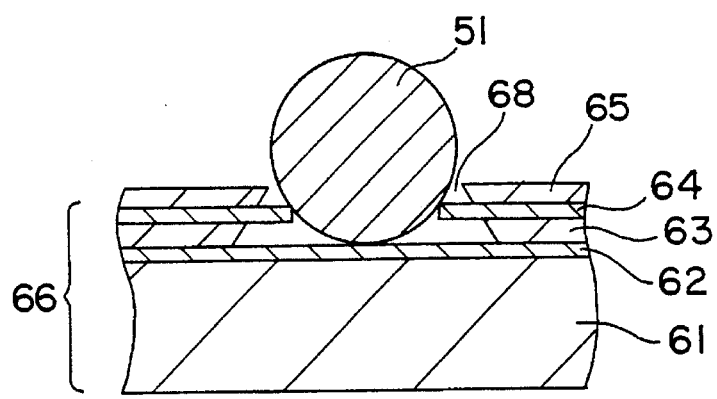
Figure 18:
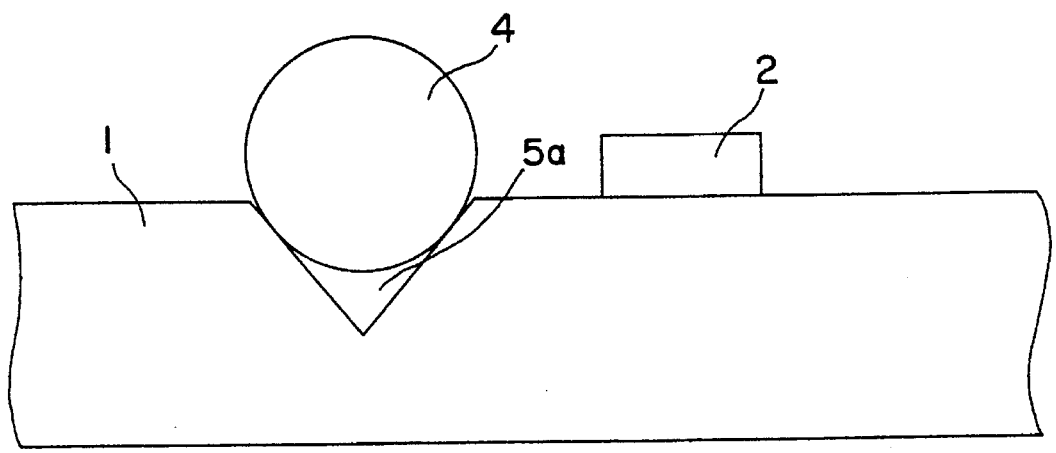
FIG. 18 is a device of the prior art.

FIG. 17(a) is a cross-sectional view showing a main part of a semiconductor laser array chip of a semiconductor laser device according to an eighth embodiment of the present invention and FIG. 17(b) is a cross-sectional view thereof in a plane perpendicular to the optical axis. In the figures, the same reference numerals as those in FIGS. 12(a)– 12(e) designate the same or corresponding elements. Reference numeral 66 designates a supporting substrate on which a first etch stopping layer 62 several microns thick, a first silicon layer 63 having the same impurity concentration as that of the supporting substrate 61, a second etch stopping layer 63 several microns thick and having a rectangular shape opening at a predetermined region, and a second silicon layer 65 having the same impurity concentration as the supporting substrate 61 are successively produced. When the diameter of the spherical lens is, for example, 260 µm, the total thickness of the first and second silicon layers is about 15 µm. Reference numeral 68 designates a hollow produced on the supporting substrate 66 having a rectangular shape, viewed from above the supporting substrate 66.

In the above-described seventh embodiment the position of the spherical lens 51 in the height direction of the supporting substrate is determined by providing an etch stopping layer 62 and arranging the spherical lens 51 in the hollow 67 having the etch stopping layer 62 at its bottom. It may be thought that, when the size of the hollow 67 in the optical axis direction of the laser chip 12 and in the length direction of the supporting substrate 60 increases over a predetermined size, a gap is produced between the hollow 67 and the spherical lens 51. Therefore, position determination of the spherical lens 51 in the optical axis direction of the laser chip 12 and in the length direction of the supporting substrate 60 becomes difficult. This eighth embodiment is directed to solving such a problem and a hollow 68 for positioning the lens 51 is formed at the supporting substrate 66 including the second etch stopping layer 64 having an aperture at a predetermined region.

As in the seventh embodiment, a first etch stopping layer 62 is formed on the silicon substrate 61 by ion implantation. Next, a polycrystalline silicon layer is formed and it is recrystallized to produce a first silicon layer 63 having the same impurity concentration as that of the silicon substrate 61. Further, ions are selectively implanted over a predetermined area of the first silicon layer 63 employing a plurality of masks, each mask having a predetermined size, whereby a second etch stopping layer 64 including a silicon layer with a high concentration of impurities and having a plurality of openings at predetermined positions is formed. Further, a polycrystalline silicon layer is produced on this second etch stopping layer 64 and is recrystallized to produce a second silicon layer 65 having the same impurity concentration as the silicon substrate 61, thereby producing the supporting substrate 66. Next, etching is performed at the location for positioning the lens 51 under the same conditions as in the seventh embodiment to reach the etch stopping layer 62 from the surface of the supporting substrate 66, thereby producing a hollow 68. The position of the opening of the second etch stopping layer 64 is set so that the opening is produced by etching only for this hollow 68. In the etching for producing this hollow 68, the first and second etch stopping layers 62 and 64 are not etched, only a part of the first etch stopping layer 62 being exposed to the bottom of the hollow 68, and the vicinity of the opening of the second etch stopping layer 64 is exposed to the hollow 68. Thereafter, as in the seventh embodiment, the laser chip array 12, the monitor photodiode array 13, and the lens 51 are arranged to produce a semiconductor laser array device.

As shown in FIG. 17(a), the position of the lens 51 engaged in the hollow 68 is determined by the first etch stopping layer 62 in the height direction of the supporting substrate. Further, the width of the second etch stopping layer 64 in the optical axis direction of the laser chip 12 is set so that the portion of the second etch stopping layer 64 exposed at the side surface of the hollow 68 is in contact with the spherical lens 51. The spherical lens 51 is then supported by the portion of the etch stopping layer 64 exposed at the side surface of the hollow 68, thereby determining the position of the spherical lens 51. In addition, as shown in FIG. 17(b), the position of the spherical lens 51 is determined in the length direction of the supporting substrate 66 by supporting the spherical lens 51 with the portion of the second etch stopping layer 64 exposed at the side surface of the hollow 68. The opening of the second etch stopping layer 63 is produced by selective ion implantation and the position of the opening and the control of the opening width can be determined with high precision. Accordingly, by adjusting the position and the size of the aperture of the second etch stopping layer 64, the position of the spherical lens 51 can be fixed at a predetermined position in the optical axis direction of the laser chip 12 and the length direction of the supporting substrate 66 with high precision.

It is also possible to determine position only in the length direction of the supporting substrate 66 or only in the optical axis direction by changing the configuration of the opening of the second etch stopping layer 64.

As described above, in this embodiment, a hollow 68 is produced at the supporting substrate 66 including a second etch stopping layer 64 having a plurality of openings of predetermined sizes at predetermined positions so that the vicinity of the opening of the etch stopping layer 64 is exposed at the side surface thereof, and a lens 52 is arranged in the hollow 68. Therefore, it is possible to produce a semiconductor laser array device in which the position determination in the optical axis direction of the lens and in the length direction of the lens is not affected by the precision of the etching.

While in the above-described fifth to eighth embodiments, a spherical lens is employed, the present invention can be applied to a lens other than a spherical lens, for example, a rod lens, and the same effects in the above-described embodiments are obtained.

While in the above-described seventh and eighth embodiments, a p conductivity type silicon substrate is employed, an n conductivity type silicon substrate may be employed with the same effects as described above.

EMBODIMENT 9

Figure 8A:
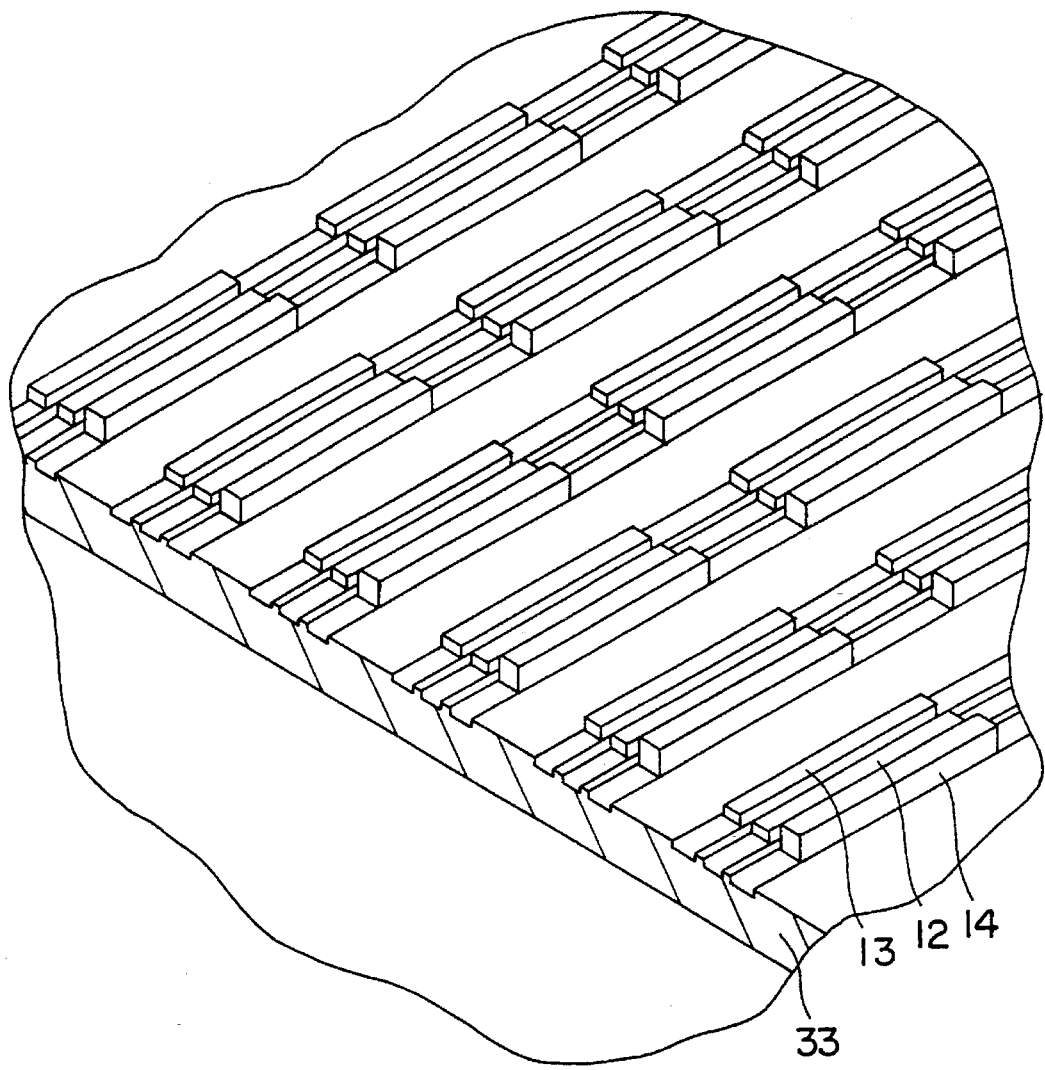
FIG. 8(a) is a perspective view illustrating a semiconductor laser array device according to a ninth embodiment of the present invention and FIG. 8(b) is an enlarged portion thereof.
Figure 8B:
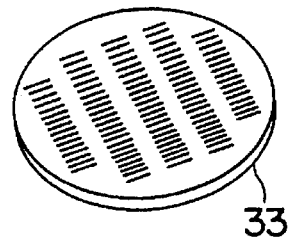

FIG. 8(a) is a perspective view illustrating a semiconductor laser array device according to a ninth embodiment of the present invention and FIG. 8(b) is an enlarged view thereof. This ninth embodiment produces many semiconductor laser array devices on the wafer 33. The silicon substrate shown in FIG. 1 need not be bar-shaped. For example, when a circular silicon wafer 33 is employed, many semiconductor laser array devices can be produced on the wafer 33 whereby a larger number of semiconductor lasers can be produced.

Similar to the first embodiment, grooves for position determination are formed at a plurality of semiconductor laser chip arrays 12, a plurality of lens arrays 14, and a plurality of monitor photodiode arrays 13 and projections 15, 18, and 10, and grooves 17a, 17b, and 17c for determining the position on the supporting substrate are formed so that determining the positions of the plurality of arrays 12, 13, and 14 on a circular silicon wafer 33 is possible. The positions of the plurality of semiconductor laser chip arrays 12, the plurality of lens arrays 14, and the plurality of monitor photodiode arrays 13 are determined and the arrays are soldered to the circular silicon wafer 33 and, thereafter, the wafer 33 is diced and separated into semiconductor laser units including lenses.

As described in this ninth embodiment, the semiconductor laser chips 12, the monitor photodiodes 13, and the lenses 14 to be mounted on a circular silicon wafer 33 are mounted after a plurality of them are collected in an array. Therefore, the number of elements arranged on the circular silicon wafer 33 is reduced and the work is simplified whereby many semiconductor laser devices can be produced relatively easily and work efficiency is enhanced.

A plurality of lenses 51 can be employed in place of a plurality of lens arrays 14 and respective lenses 51 may be arranged and positioned on a wafer, as in the fifth to eighth embodiments, with the same effects obtained.

EMBODIMENT 10

Figure 9:
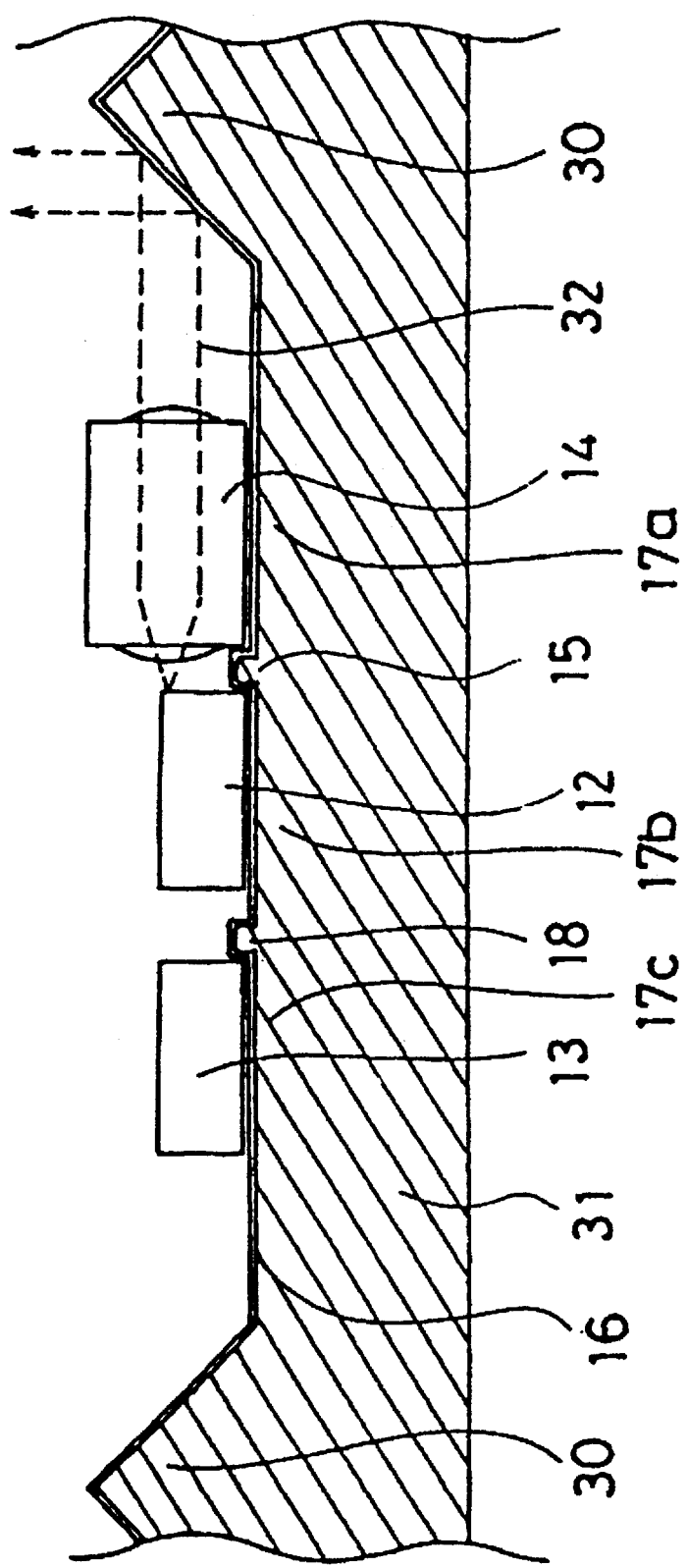
FIG. 9 is a cross-sectional view illustrating a semiconductor laser array device according to a tenth embodiment of the present invention.

FIG. 9 shows a cross-sectional view of a semiconductor laser device according to a tenth embodiment of the present invention. This tenth embodiment has a reflecting projection 30 on the silicon substrate 11, reflecting the laser beam 2 upwards. The reflecting projections 30 are formed by etching the supporting substrate 11 having a (110) surface as a main surface so that a surface 45 is exposed by KOH etching.

As described above, in this tenth embodiment, by forming reflecting projections 30 on the silicon substrate 11, the semiconductor laser device can be inspected before element separation and optical characteristics thereof can be measured whereby many semiconductor laser devices can be inspected simply relative to inspections of the individual devices after separation into respective elements. Therefore, work efficiency can be enhanced with the same effects obtained as in the first embodiment.

EMBODIMENT 11

Figure 10A:
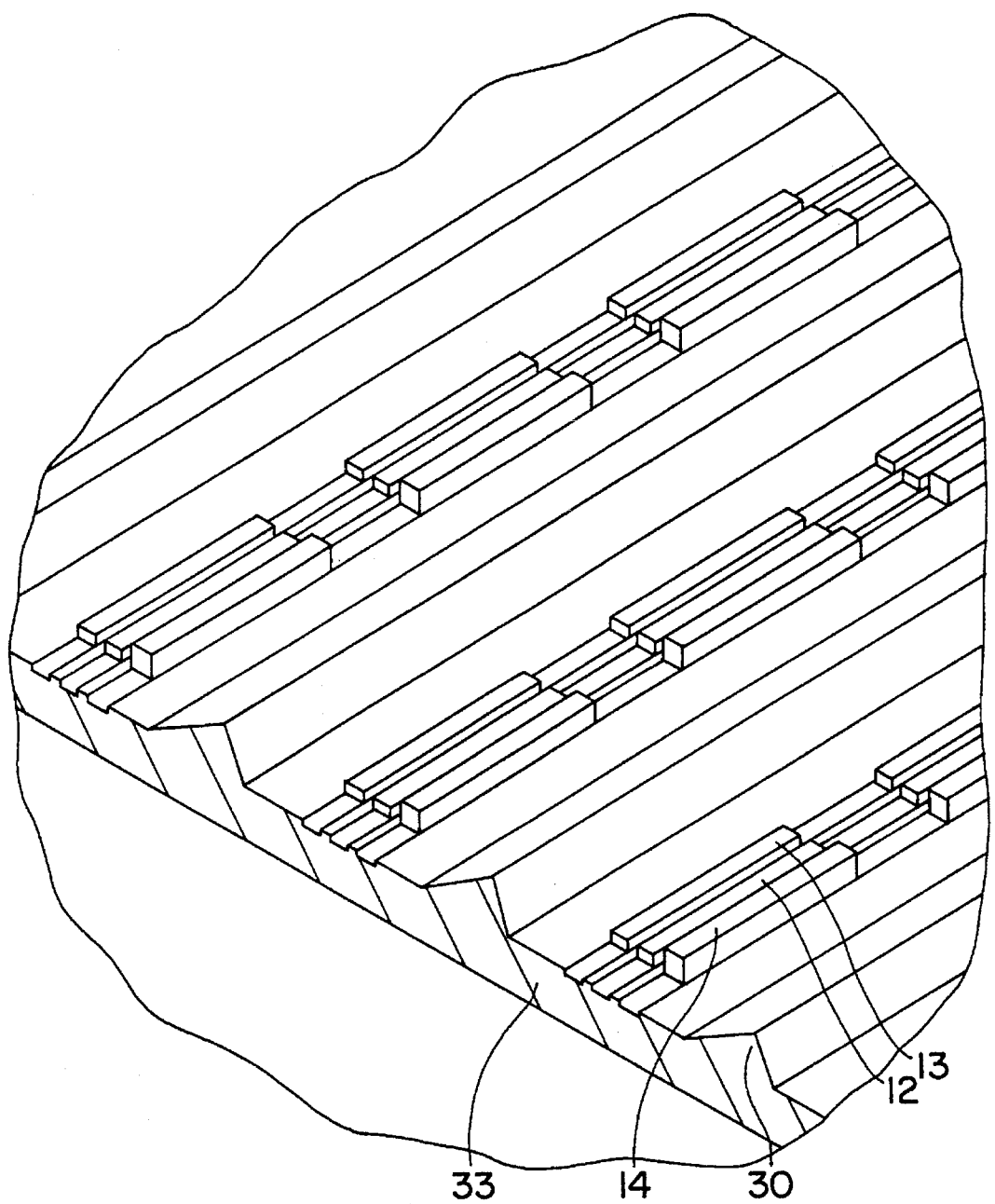
FIG. 10(a) is a perspective view illustrating a semiconductor laser array device according to an eleventh embodiment of the present invention and FIG. 10(b) is an enlarged portion thereof.
Figure 10B:
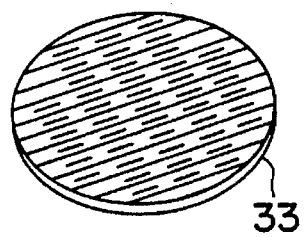
Figure 11:
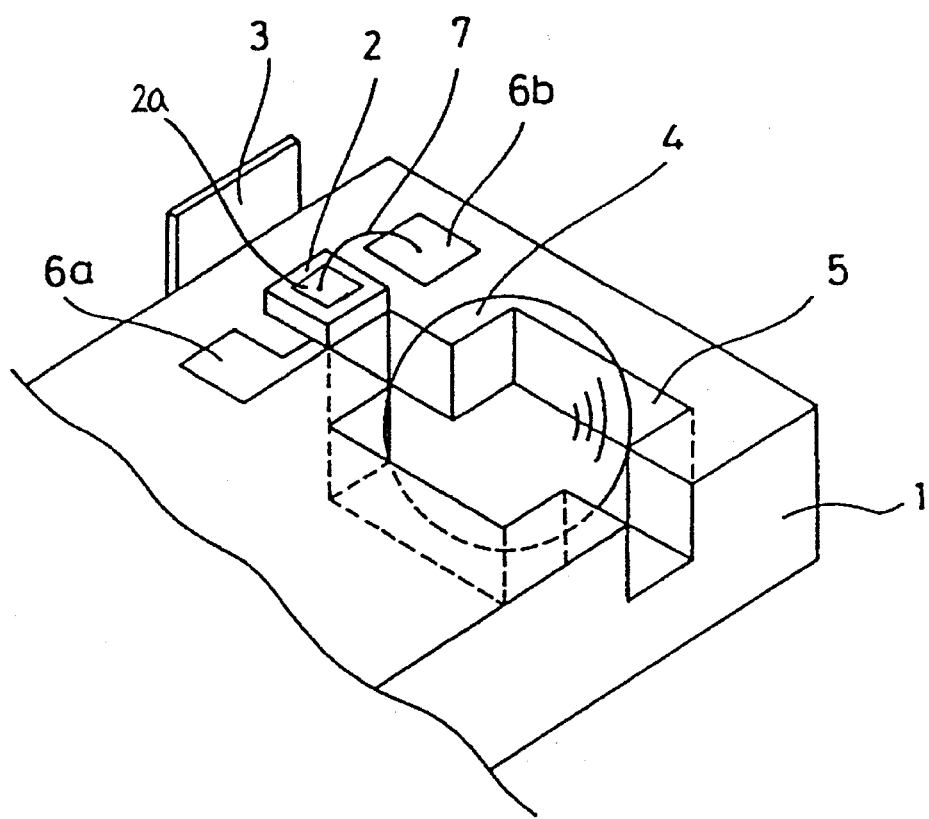
FIG. 11 is a perspective view illustrating a prior art semiconductor laser device.

FIGS. 10(a) and 10(b) are a perspective view and an enlarged view, respectively, illustrating a semiconductor laser array device according to an eleventh embodiment of the present invention. This embodiment produces a large number of semiconductor laser array devices and a plurality of reflecting projections on the wafer 30. This eleventh embodiment is an embodiment combining the ninth embodiment and the tenth embodiment. A circular silicon wafer 33 that can receive a large number of semiconductor laser array devices is employed as a supporting substrate in place of the silicon substrate 11. Therefore, the optical characteristics of the laser beam of the individual laser devices can be measured and inspected in a wafer state, so that a plurality of semiconductor laser devices can be tested at one time employing an automatic wafer tester, thereby greatly enhancing productivity.

In this eleventh embodiment, by forming a large number of semiconductor laser array devices and a plurality of reflecting projections 30 on the wafer 33, the optical characteristics of the laser beam of the individual semiconductor laser devices can be measured and inspected whereby a large number of semiconductor laser devices can be produced and inspected easily. Thus, work efficiency and productivity can be enhanced.

In the respective embodiments, silicon is employed as the supporting substrate but the present invention can be applied where the supporting substrate comprises other materials and the same effects as described for the respective embodiments are obtained.

Japanese Published Patent Application 61-116895 discloses a production method of a semiconductor laser in which, by putting a position determining tool 7 in a groove 5 of the semiconductor wafer 1 that is formed by half-dicing, the position of a large number of laser chips 6 that are in separate element units is determined. However, this method is not one in which the laser chip array 12 position is determined on the semiconductor substrate 11 and then dicing is performed to separate the substrate and arrays into elements, as in the present invention. Therefore, it is not possible to determine the positions and mounting of many laser diodes simultaneously, thereby enhancing productivity as in the present invention.

Japanese Published Patent Application 61-281577 discloses a semiconductor light emitting element 2 and lens plate 3 formed on the same substrate. However, the semiconductor laser chip array 12, the monitor photodiode array 13, and the lens array 14 are adhered to a bar-shaped silicon substrate 11 for position determination, followed by dicing for separation into individual elements. Therefore, it is not possible to simply produce semiconductor laser devices, each device comprising a semiconductor laser chip, a monitor photodiode, and a lens with high productivity and efficiency.

Japanese Published Patent Application 61-29188 discloses a laser diode container in which a projection structure 27 for position determination is formed at a stem mounting base for mounting the heat sink 22 with a laser chip. However, a laser chip array 12 is not mounted on a semiconductor substrate with dicing thereafter to separate elements. Therefore, there is no enhancement of productivity due to position determination of a large number of the laser diodes at the same time.

What is claimed is:

1. A semiconductor laser array device comprising:

a semiconductor laser chip array comprising a plurality of semiconductor laser chips arranged repetitively in an array having a period, each laser chip having a prescribed chip width and an optical axis;

a bar-shaped supporting substrate having an array direction parallel to a length direction of said supporting substrate, said semiconductor laser chip array being mounted on said supporting substrate;

a monitor photodiode array comprising a plurality of monitor photodiodes arranged in an array with a period that is the same period as said semiconductor laser chip array, said monitor photodiode array being mounted on said supporting substrate, having an array direction parallel to the length direction of said supporting substrate, and having a determined position along the optical axis directions of said laser chips and in the length direction and a height direction of said support substrate, wherein positions of said semiconductor laser chip array and said monitor photodiode array are determined in the optical axis direction of said laser chip by either of a groove in or a projection on said supporting substrate and extending along the length direction of said supporting substrate; and a plurality of lenses mounted on said supporting substrate arranged in an array in the length direction of said supporting substrate with a period that is the same period as said semiconductor laser chip array, said plurality of lenses having positions determined along the optical axis directions of said laser chips and in the length direction and the height direction of said supporting substrate by hollows in said supporting substrate along one of the optical axis directions of said laser chips, respective semiconductor laser chips, monitor photodiodes, and lenses constituting individual semiconductor laser devices, wherein said supporting substrate includes a semiconductor substrate having a dopant impurity concentration, an etch stopping layer disposed on said semiconductor substrate, and a semiconductor layer having a thickness and the same composition and dopant impurity concentration as said semiconductor substrate disposed on said etch stopping layer, the hollows being produced by selectively etching said semiconductor layer of said supporting substrate to a depth reaching said etch stopping layer so that said etch stopping layer is exposed in the hollows, said plurality of lenses being disposed in contact with said etch stopping layer exposed in the hollows and determined in position in the height direction of said supporting substrate by said etch stopping layer exposed in the hollows.

2. The semiconductor laser array device of claim 1 wherein said supporting substrate is a circular wafer.

3. A semiconductor laser array device comprising:

a semiconductor laser chip array comprising a plurality of semiconductor laser chips arranged repetitively in an array having a period, each laser chip having a prescribed chip width and an optical axis;

a bar-shaped supporting substrate having an array direction parallel to a length direction of said supporting substrate, said semiconductor laser chip array being mounted on said supporting substrate;

a monitor photodiode array comprising a plurality of monitor photodiodes arranged in an array with a period that is the same period as said semiconductor laser chip array, said monitor photodiode array being mounted on said supporting substrate, having an array direction parallel to the length direction of said supporting substrate, and having a determined position along the optical axis directions of said laser chips and in the length direction and a height direction of said support substrate, wherein the position of said semiconductor laser chips are determined in the length direction of said supporting substrate by either a groove in or a projection on said semiconductor laser chip array and a complementary projection on or a groove in said supporting substrate engaged with the groove in or the projection on said semiconductor laser chip array, and the position of said monitor photodiode array is determined in the length direction of said supporting substrate by either a groove in or a projection on said supporting substrate and either a projection on or a groove in said supporting substrate complementary and engaged with the groove in or the projection on said monitor photodiode array;

a plurality of lenses mounted on said supporting substrate arranged in an array in the length direction of said supporting substrate with a period that is the same period as said semiconductor laser chip array, said plurality of lenses having positions determined along the optical axis directions of said laser chips and in the length direction and the height direction of said supporting substrate, respective semiconductor laser chips, monitor photodiodes, and lenses constituting individual semiconductor laser devices.

4. A semiconductor laser array device comprising:

a semiconductor laser chip array comprising a plurality of semiconductor laser chips arranged repetitively in an array having a period, each laser chip having a prescribed chip width and an optical axis;

a bar-shaped supporting substrate having an array direction parallel to a length direction of said supporting substrate, said semiconductor laser chip array being mounted on said supporting substrate;

a monitor photodiode array comprising a plurality of monitor photodiodes arranged in an array with a period that is the same as the period of said semiconductor laser chip array, said monitor photodiode array being mounted on said supporting substrate, having an array direction parallel to the length direction of said supporting substrate, and having a determined position along the optical axis directions of said laser chips and in the length direction and a height direction of said support substrate, wherein positions of said semiconductor laser chip array and said monitor photodiode array are determined in the optical axis direction of said laser chip by either of a groove in or a projection on said supporting substrate and extending along the length direction of said supporting substrate; and a plurality of lenses mounted on said supporting substrate arranged in an array in the length direction of said supporting substrate with a period that is the same as the period of said semiconductor laser chip array, said plurality of lenses having positions determined along the optical axis directions of said laser chips and in the length direction and the height direction of said supporting substrate, respective semiconductor laser chips, monitor photodiodes, and lenses constituting individual semiconductor laser devices, said lens array being mounted on said supporting substrate along the length direction of said supporting substrate, the position of said lens array being determined in the length direction of said supporting substrate by either a groove or a projection at respective lenses of said lens array and at either a projection on or a groove in said supporting substrate engaged with the groove or the projection at the respective lenses.

5. A semiconductor laser array device comprising:

a semiconductor laser chip array comprising a plurality of semiconductor laser chips arranged repetitively in an array having a period, each laser chip having a prescribed chip width and an optical axis;

a bar-shaped supporting substrate having an array direction parallel to a length direction of said supporting substrate, said semiconductor laser chip array being mounted on said supporting substrate;

a monitor photodiode array comprising a plurality of monitor photodiodes arranged in an array with a period that is the same as the period of said semiconductor laser chip array, said monitor photodiode array being mounted on said supporting substrate, having an array direction parallel to the length direction of said supporting substrate, and having a determined position along the optical axis directions of said laser chips and in the length direction and a height direction of said support substrate, wherein positions of said semiconductor laser chip array and said monitor photodiode array are determined in the optical axis direction of said laser chip by either of a groove in or a projection on said supporting substrate and extending along the length direction of said supporting substrate; and a plurality of lenses mounted on said supporting substrate arranged in an array in the length direction of said supporting substrate with a period that is the same as the period of said semiconductor laser chip array, said plurality of lenses having positions determined along the optical axis directions of said laser chips and in the length direction and the height direction of said supporting substrate by hollows in said supporting substrate along one of the optical axis directions of said laser chips, respective semiconductor laser chips, monitor photodiodes, and lenses constituting individual semiconductor laser devices, wherein said supporting substrate includes a semiconductor substrate having a dopant impurity concentration, a first etch stopping layer exposed on said semiconductor substrate, a semiconductor layer having the same composition and dopant impurity concentration as said semiconductor substrate, and a second etch stopping layer having apertures with a configuration and size and disposed on the first etch stopping layer, the hollows being produced by selectively etching a portion of said semiconductor layer of said supporting substrate at the apertures in said second etch stopping layer to a depth reaching said first etch stopping layer so that said first etch stopping layer is exposed in the hollows and the apertures in said second etch stopping layer expose side surfaces of the hollows, said lenses being disposed in contact with said first etch stopping layer exposed in respective hollows and with said second etch stopping layer at the side surfaces of hollows, said lenses being determined in position along one of the optical axis directions of said laser chips and the length direction of said supporting substrate by said second etch stopping layer.

6. A supporting substrate for a semiconductor laser device comprising:

a supporting substrate comprising a semiconductor substrate having a dopant impurity concentration, an etch stopping layer disposed on said semiconductor substrate, and a semiconductor layer disposed on said etch stopping layer comprising the same material and dopant impurity concentration as said semiconductor substrate;

a hollow in said semiconductor layer reaching and exposing said etch stopping layer said layer in the hollow; and a lens disposed in the hollow in contact with said etch stopping layer in the hollow wherein the position of said lens is determined in a height direction of said supporting substrate by said etch stopping layer exposed in the hollow.

7. A supporting substrate for a semiconductor laser device comprising:

a supporting substrate having a thickness comprising a semiconductor substrate having a dopant impurity concentration, a first etch stopping layer disposed on said semiconductor substrate, and a semiconductor layer including a second etch stopping layer having an aperture with a configuration and size, comprising the same material and dopant impurity concentration as said semiconductor substrate, disposed on said first etch stopping layer;

a hollow in said semiconductor layer of said supporting substrate at the aperture of said second etch stopping layer reaching and exposing said first etch stopping layer in the hollow with said second etch stopping layer exposed at side surfaces of the hollow; and a lens disposed in contact with said first etch stopping layer exposed in the hollow and said second etch stopping layer at the side surfaces of the hollow and determined in position along one of an optical axis direction of said laser chip and a length direction of said supporting substrate by said second etch stopping layer.

8. A method for producing a semiconductor laser array device comprising:

producing a semiconductor laser chip array including a plurality of semiconductor laser chips, each laser chip having a prescribed chip width in a repeating array with a period;

producing a monitor photodiode array including a plurality of monitor photodiodes in an array with a period the same as the period of said semiconductor laser chip array;

producing a supporting substrate including forming a first groove in or a first projection on said supporting substrate for determining the position of said semiconductor laser chip array and said monitor photodiode array along optical axis directions of said laser chip array and said monitor photodiode array on said supporting substrate;

producing either a groove in or a projection on said semiconductor laser chip array and said monitor photodiode array for determining the position of said semiconductor laser chip array and said monitor photodiode array in the length direction of said supporting substrate;

producing either a second projection on or a second groove in said supporting substrate for complementary engagement with the groove in or projection on said semiconductor laser chip array;

producing either a third projection on or a third groove in said supporting substrate for complementary engagement with the groove in or projection on said monitor photodiode array;

disposing said semiconductor laser chip array on said supporting substrate by urging, in the optical axis direction, said semiconductor laser chip array against a side wall of the first groove in on the first projection on said supporting substrate, engaging the groove in or the projection on said semiconductor laser chip array with the second groove in or the second projection on said supporting substrate, and fixing said semiconductor laser chip array to said supporting substrate;

disposing said monitor photodiode array on said supporting substrate by urging, in the optical axis direction, said monitor photodiode array against a side wall of the first groove in or the first projection on said supporting substrate, engaging the groove in or the projection on said monitor photodiode array with the third projection on or the groove in said monitor photodiode array, and fixing said monitor photodiode array to said supporting substrate; and disposing a plurality of lenses on said bar-shaped supporting substrate along the optical axis directions of said laser chips with a period the same as the period of said semiconductor laser chip array.

9. The production method of claim 8 comprising etching said supporting substrate to form hollows for determining positions of said plurality of lenses wherein disposing said plurality of lenses on said supporting substrate comprises disposing said plurality of lenses in the hollows of said supporting substrate and fixing the lenses to said supporting substrate.

10. The production method of claim 9 comprising:

producing said supporting substrate by successively depositing an etch stopping layer and a semiconductor layer comprising the same material and dopant impurity concentration as said semiconductor substrate on said semiconductor substrate;

producing the hollows by selectively etching the semiconductor layer to a depth reaching said etch stopping layer to expose said etch stopping layer in the hollows; and disposing said lenses in respective hollows in contact with the etch stopping layer exposed in the hollows.

11. The production method of claim 9 comprising:

producing said supporting substrate by successively depositing a first etch stopping layer and a semiconductor layer comprising the same composition and dopant impurity concentration as said semiconductor substrate and a second etch stopping layer on said semiconductor substrate;

producing the hollows by etching a portion of the semiconductor layer at apertures of said second etch stopping layer to a depth reaching said first etch stopping layer so that the first etch stopping layer is exposed in the hollows and said second etch stopping layer is exposed at side surfaces of the hollows; and disposing said lenses in contact with said first etch stopping layer in respective hollows and in contact with said second etch stopping layer at the side surfaces of the hollows.

12. The production method of claim 9 wherein disposing said plurality of lenses comprises employing a sieve member having a plurality of openings of a prescribed shape with the same period as the period of said laser chip array and through which said lenses can pass, aligning the positions of said plurality of openings of said sieve member and the positions of the lenses on said supporting substrate, thereby placing all of the plurality of lenses in the openings at one time, and pushing the plurality of lenses with a plate-shaped pushing member toward said supporting substrate and, thereafter, fixing the plurality of lenses to said supporting substrate.

13. The production method of claim 9, comprising, after producing the hollows, disposing an adhesive for fixing said lenses to said supporting substrate in the hollows by screen printing.

14. The production method of claim 8 comprising:

producing reflecting projections for reflecting a laser beam emitted from each of said semiconductor laser devices on said supporting substrate; and testing said respective semiconductor laser devices by utilizing the laser beam from said respective semiconductor laser devices in the array state.

15. The production method of claim 8 wherein said supporting substrate is a circular wafer.

16. A method for producing a semiconductor laser array device comprising:

producing a semiconductor laser chip array including a plurality of semiconductor laser chips, each laser chip having a prescribed chip width in a repeating array with a period;

producing a monitor photodiode array including a plurality of monitor photodiodes in an array with a period the same as the period of said semiconductor laser chip array;

disposing said laser chip array on a supporting substrate having a bar shape and determining the laser chip position along optical axis directions of said semiconductor laser chips and in a length direction and a height direction of said supporting substrate;

disposing said monitor photodiode array on said supporting substrate and determining the position of said monitor photodiode array along the optical axis directions of said laser chips and in the length direction and the height direction of said supporting substrate;

producing a lens array including a plurality of lenses in an array with a period the same as the period of said semiconductor laser chip array;

forming either a first groove in or a first projection on said supporting substrate for determining the position of said lens array on said supporting substrate;

forming either a projection on or a groove in said lens array for determining the position of the lenses in the length direction of said supporting substrate;

forming either a second projection on or a second groove in said supporting substrate for engagement with either of the projection or groove of said lens array; and disposing said plurality of lenses on said supporting substrate by urging said lens array in the optical axis direction of said lenses against a side wall of the first groove in or the first projection on said supporting substrate and engaging either the groove or the projection of said lens array and either the second projection on or the second groove in said supporting substrate, adjusting the height of said supporting substrate, and fixing said lens array to said supporting substrate.

17. A supporting substrate for a method for producing a semiconductor laser device comprising:

successively producing, on a semiconductor substrate, an etch stopping layer and a semiconductor layer having a composition and dopant impurity concentration the same as said semiconductor substrate to produce a supporting substrate;

selectively etching said semiconductor layer to a depth reaching said etch stopping layer to produce a hollow in which said etch stopping layer is exposed; and disposing a lens in the hollow in contact with said etch stopping layer.

18. A supporting substrate for a method for producing a semiconductor laser device comprising:

producing, on a semiconductor substrate, a semiconductor layer having the same composition and dopant impurity concentration as said semiconductor substrate, a first etch stopping layer, and a second etch stopping layer having an aperture with a configuration and size;

etching a portion of said semiconductor layer at the aperture of said second etch stopping layer to expose said first etch stopping layer in the hollow; and disposing a lens in the hollow in contact with a part of said first etch stopping layer in the hollow and said second etch stopping layer at a side surface of the hollow.

* * * * *